United States Patent
Ji et al.

(10) Patent No.: US 10,498,004 B1
(45) Date of Patent: Dec. 3, 2019

(54) WIDEBAND DUAL DIRECTIONAL COUPLER

(71) Applicant: Avago Technologies International Sales Pte. Limited, Singapore (SG)

(72) Inventors: Donghyeon Ji, Gyeonggi-do (KR); Hyungbin Lee, Seoul (KR); Junghyun Kim, Gyeonggi-do (KR)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 16/049,332

(22) Filed: Jul. 30, 2018

(51) Int. Cl.
| | | |
|---|---|---|
| *H03K 17/687* | (2006.01) | |
| *H01P 5/18* | (2006.01) | |
| *H04B 1/18* | (2006.01) | |
| *H03K 17/693* | (2006.01) | |
| *H03H 7/38* | (2006.01) | |

(52) U.S. Cl.
CPC ............ *H01P 5/18* (2013.01); *H03H 7/38* (2013.01); *H03K 17/693* (2013.01); *H04B 1/18* (2013.01)

(58) Field of Classification Search
CPC .......... H01P 5/18; H03H 7/38; H03K 17/693; H04B 1/18
USPC ...................................................... 327/427
See application file for complete search history.

(56) References Cited

U.S. PATENT DOCUMENTS

| | | | | |
|---|---|---|---|---|
| 2007/0222539 A1* | 9/2007 | Antkowiak | ............. | H01P 5/183 333/115 |
| 2008/0025350 A1* | 1/2008 | Arbore | ............... | G02B 6/12011 372/20 |
| 2016/0249416 A1* | 8/2016 | Elboim | ..................... | H05B 6/72 |
| 2018/0054257 A1* | 2/2018 | Witzens | ............... | H04B 10/038 |
| 2018/0138818 A1* | 5/2018 | Yang | ................. | H02M 3/33523 |

OTHER PUBLICATIONS

Donghyeon Ji et al., "A Multiband Directional Coupler Using SOI CMOS for RF Front-End Applications", IEEE Microwave and Wireless Components Letters, vol. 28, No. 2, Feb. 2018, 126-128.
K. Sachse and A. Sawicki, "Quasi-ideal multilayer two- and three-strip directional couplers for monolithic and hybrid MICs," IEEE Trans. Microw. Theory Techn., vol. 47, No. 9, Sep. 1999, pp. 1873-1882.

(Continued)

*Primary Examiner* — Ryan Jager
(74) *Attorney, Agent, or Firm* — Sheridan Ross P.C.

(57) ABSTRACT

A directional coupler device includes an asymmetric dual directional coupler for receiving a radio frequency (RF) signal and a switching circuit. The asymmetric dual directional coupler includes a main line having an input port and an output port, multiple coupled lines separated from the main line, the coupled lines having different lengths for providing different coupling factors, respectively, where each coupled line has first and second ports. The switching circuit selectively applies one of the different coupling factors of the coupled lines, depending on frequency of the RF signal in relation to a predetermined threshold frequency, while coupling a portion of forward power or reverse power of the RF signal to a coupling reading port, to mitigate power loss in an upper frequency range of the RF signal, while satisfying coupling criteria.

20 Claims, 11 Drawing Sheets

(56) References Cited

OTHER PUBLICATIONS

R. C. Frye, R. Melville, G. Badakere, Y. Lin, and K. Liu, "Theory of compact narrow-band directional couplers and implementation in silicon IPD technology," in IEEE MTT-S Int. Microw. Symp. Dig., Boston, MA, Jun. 2009, pp. 993-996.

F. Gianesello, C. Durand, and D. Gloria, "0.35 dB loss 20 dB coupling directional coupler integrated in 130 nm CMOS SOI technology targeting 3G PA SOC," in Proc. Conf. Silicon Monolithic Integr. Circuits in RF Syst., Newport Beach, CA, Jan. 2014, pp. 29-31.

V. Solomko, B. Tanc, D. kehrer, N. Ilkov, W. Bakalski, and W. Simbürger, "Tunable directional coupler for RF front-end applications," Electron. Lett., vol. 51, No. 24, Nov. 2015, pp. 2012-2014.

K. Yamamoto, H. Kurusu, S. Suzuki, and M. Miyashita, "High directivity enhancement with passive and active bypass circuit techniques for GaAs MMIC microstrip directional couplers," IEEE Trans. Microw. Theory Techn., vol. 59, No. 12, Dec. 2011, pp. 3095-3107.

J. Cui, L. Chen, and Y. Liu, "Monolithic single-pole sixteen-throw T/R switch for next-generation front-end module," IEEE Microw. Compon. Lett., vol. 24, No. 5, May 2014, pp. 345-347.

X. S. Wang and C. P. Yue, "A dual-band SP6T T/R switch in SOI CMOS with 37-dBm P-0.1dB for GSM/W-CDMA handsets," IEEE Trans. Microw. Theory Techn., vol. 62, No. 4, Apr. 2014, pp. 861-870.

* cited by examiner

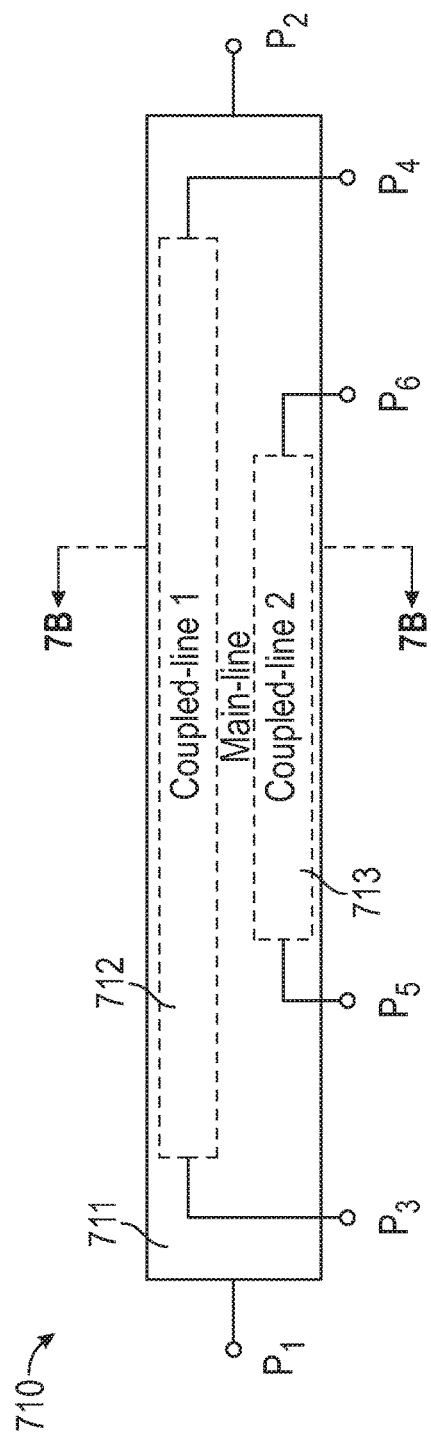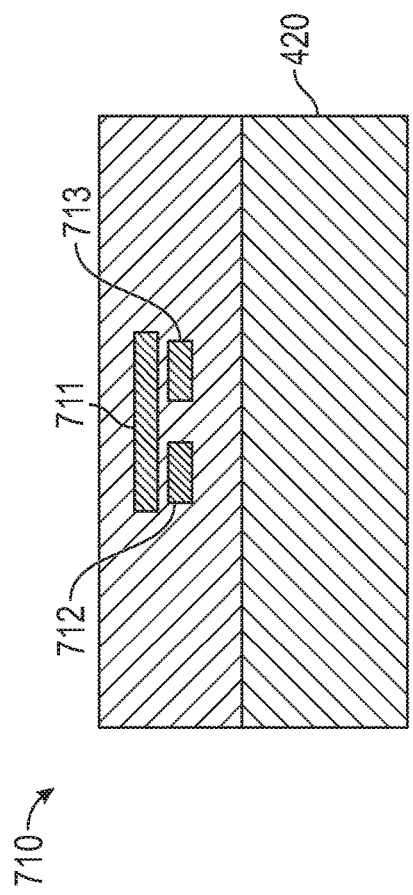
FIG. 7A
FIG. 7B

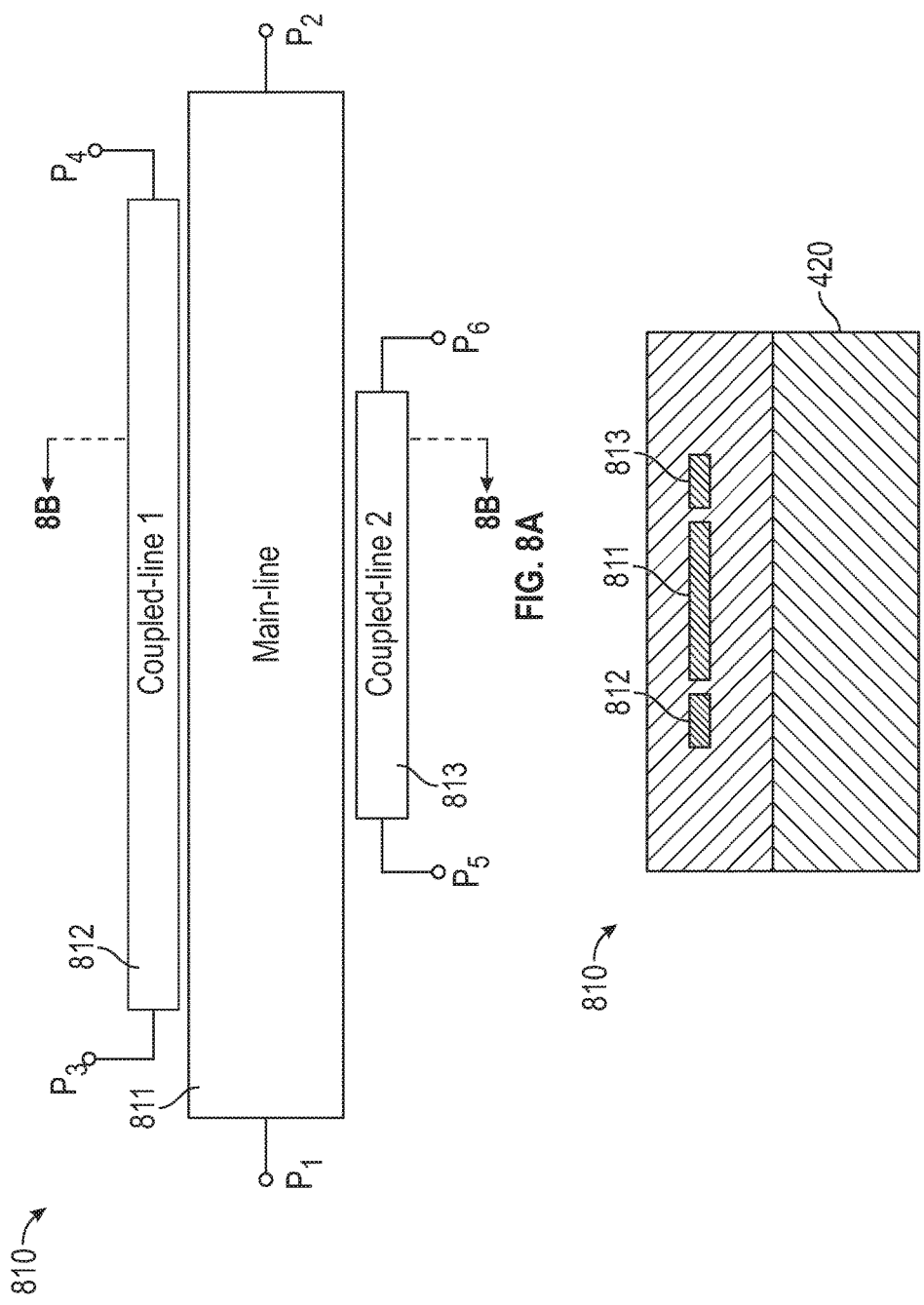

WIDEBAND DUAL DIRECTIONAL COUPLER

STATEMENT REGARDING PRIOR DISCLOSURES BY THE INVENTORS UNDER 37 CFR 1.77(b)(6)

Embodiments of the subject wideband dual directional coupler(s) were disclosed in an article entitled "A Multi-Band Directional Coupler Using SOI CMOS for RF Front-End Application," IEEE Microwave and Wireless Components Letters, Vol. 28, No. 2 (Feb. 2, 2018). A copy of the article is submitted with an information disclosure statement that is being concurrently filed herewith. The publication is believed to fall under the exception of 35 U.S.C. § 102(b)(1) and is therefore believed not to constitute prior art.

BACKGROUND

A modern wireless communication device includes a front-end stage, typically having at least a power amplifier and a matching network, coupled to an antenna for sending and/or receiving radio frequency (RF) signals. A directional coupler may be located between the front-end stage and the antenna, where it enables reading of forward and reverse power levels and/or detection of load mismatch conditions of the antenna.

A conventional directional coupler used in a mobile wireless communication device, such as a cellular telephone, is typically compact in size and shows sufficient directivity over 20 dB through well constructed mutual inductance and capacitance. However, because the directional coupler has one coupled line for coupling to a main line, and its coupling factor is proportional to frequency of the RF signal, the directional coupler experiences excessive power loss in higher frequency ranges due to strong coupling. The length of the directional coupler may be made shorter to avoid the strong coupling and excessive power loss in the higher frequency range, but this generally results in inadequate coupling in lower frequency ranges. Therefore, the directional coupler is used within a limited bandwidth, determined in part by the length of the directional coupler, even when the corresponding coupling factor satisfies the desired criteria. The limited bandwidth makes it difficult to cover entire frequency bands of various communications standards, such as long-term evolution (LTE), which covers a total frequency band from 0.69 GHz to 4.00 GHz, for example.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawing figures.

FIG. 7A is a top plan view of an asymmetric dual directional coupler, according to a representative embodiment.

FIG. 7B is a cross-sectional view of the asymmetric dual directional coupler in FIG. 7A, according to a representative embodiment.

FIG. 8A is a top plan view of an asymmetric dual directional coupler, according to a representative embodiment.

FIG. 8B is a cross-sectional view of the asymmetric dual directional coupler in FIG. 8A, according to a representative embodiment.

DETAILED DESCRIPTION

Figure 1A:
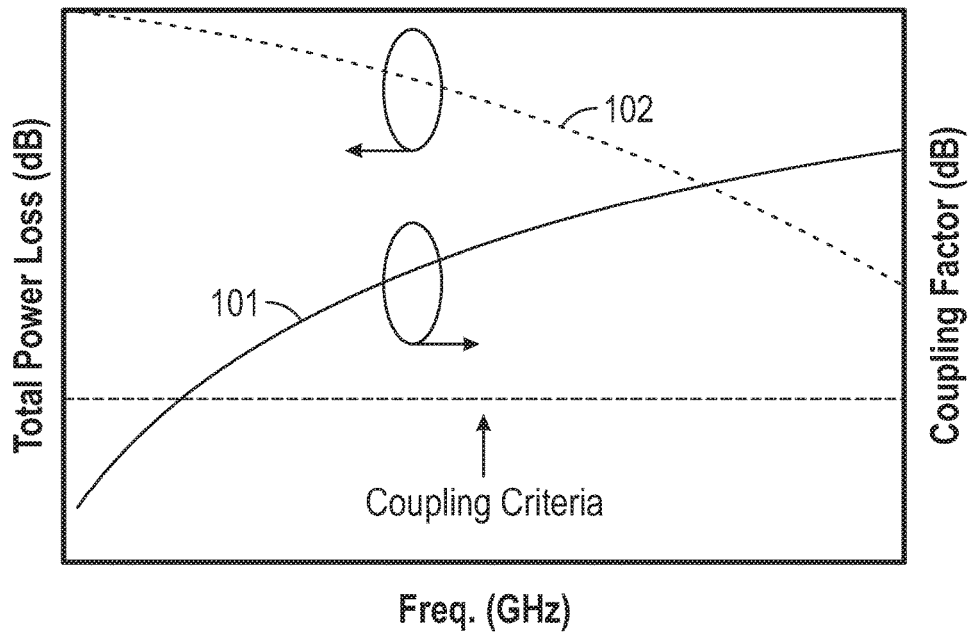
FIG. 1A is a graph showing coupling factor and total power loss of a conventional directional coupler having a single coupled line over a wide frequency range.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that as used in the specification and appended claims, the terms "a", "an" and "the" include both singular and plural referents, unless the context clearly dictates otherwise. Thus, for example, "a component" includes one component and plural components.

As used in the specification and appended claims, and in addition to their ordinary meanings, the terms "substantial" or "substantially" mean to within acceptable limits or degree. For example, the term "substantial amount" means that one skilled in the art would consider the amount to be greater than an average, and acceptable for stated purposes within the context in which the term is used. As a further example, "substantially removed" means that one skilled in the art would consider the removal to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Unless otherwise noted, when a first device is said to be connected to a second device, this encompasses examples where one or more intermediate devices may be employed to connect the two devices to each other. However, when a first device is said to be directly connected to a second device, this encompasses examples where the two devices are connected to each other without any intermediate or intervening devices.

According to various embodiments, a wideband direction coupler device is provided that extends an applicable frequency range and decreases power loss by loosening the coupling strength as much as the desired criteria in the higher frequency range. In this way, a directional coupler can maintain low power loss over a wider frequency range. Herein, wideband refers to a total bandwidth of at least 1 GHz, which may be one continuous bandwidth or may include multiple smaller bandwidths or channels (multiband) collectively making up the wideband total bandwidth. For example, the LTE communication standard is multiband, covering a wideband total frequency band from 0.69 GHz to 4.00 GHz, comprising multiple discrete frequency bands.

More particularly, the wideband directional coupler device is an asymmetric dual directional coupler including two asymmetric coupled lines that provide two different coupling factors, and a coupling switching stage that facilitates selection of the coupling factors to accommodate different frequency ranges and to enable reading of forward and reverse powers using a single coupler core. The coupler reading ports may be connected to an external power sensing circuit or RF power detector integrated circuit (IC), such as an inductive sensor, a resistance circuit, a log detector, a root mean square (RMS) detector, and/or a peak/envelope detector, for example, that reads the forward and reverse power levels. Depending on the desired frequency range, the asymmetric coupled lines may be electrically coupled or floated by the switching stage to mitigate excessive power loss in an upper (higher) frequency range, while satisfying coupling criteria, thereby substantially enlarging the applicable frequency range. For example, the wideband directional coupler device may effectively cover the entire frequency band covered by LTE with low power loss of less than about −0.21 dB.

FIG. 1A is a graph showing coupling factor and total power loss of a conventional directional coupler having a single coupled line over a wide frequency range (broadband or wideband). As shown in FIG. 1A, the conventional directional coupler is effectively a narrow band device. Trace 101 shows the coupling factor (in dB) (indicated by an arrow pointing to the right y-axis), which increases proportionally with the frequency of the RF signal, until at higher frequencies, the coupler factor is far above the coupling criteria. Trace 102 shows the total power loss (in dB) of the directional coupler (indicated by an arrow pointing to the left y-axis), which also increases proportionally with the frequency of the RF signal. As shown by traces 101 and 102, the directional coupler experiences excessive power loss due to the strong coupling at the higher frequencies.

Figure 1B:
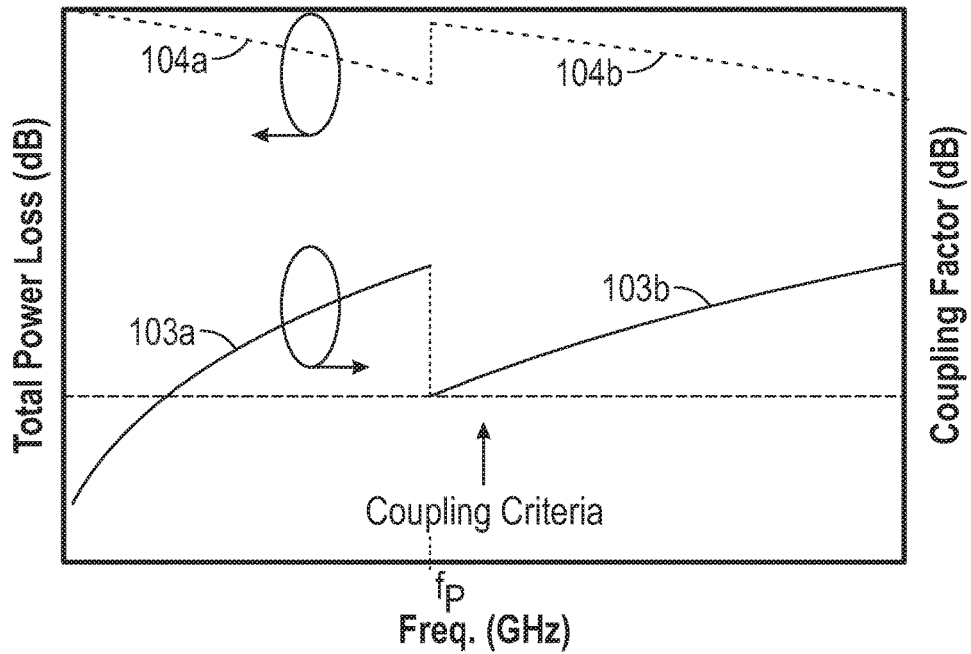
FIG. 1B is a graph showing coupling factor and total power loss of a directional coupler having multiple coupled lines over a wide frequency range, according to representative embodiments.

In comparison, FIG. 1B is a graph showing coupling factor and total power loss of a directional coupler having multiple coupled lines over the broad frequency range, according to various representative embodiments. Traces 103a and 103b show the coupling factor (in dB) (indicated by an arrow pointing to the right y-axis) provided by the first and second coupling factors of the coupled lines, respectively. Trace 103a increases proportionally with the frequency of the RF signal according to the first coupling factor until the frequency reaches a predetermined transition frequency fp, at which the directional coupler switches to the second coupling factor causing a drop. The trace 103b then increases proportionally with the frequency of the RF signal according to the second coupling factor. However, the traces 103a and 103b indicate that the overall coupling factor remains within a usable range from the coupling criteria, even at the highest frequency.

Traces 104a and 104b show the total power loss (in dB) of the directional coupler (indicated by an arrow pointing to the left y-axis), according to representative embodiments, which also increases proportionally with the frequency of the RF signal. Again, when the frequency reaches the predetermined transition frequency fp and the directional coupler switches from the first coupling factor to the second coupling factor, the total power loss indicated by the trace 104a drops in value, and the trace 104b begins increasing proportionally with the frequency of the RF signal. However, the traces 104a and 104b indicate that the total power loss remains within a usable range (does not become excessive), even at the highest frequency. In this way, the directional coupler according to the representative embodiments is able to maintain acceptably low total power loss over a wider frequency range.

Figure 2:
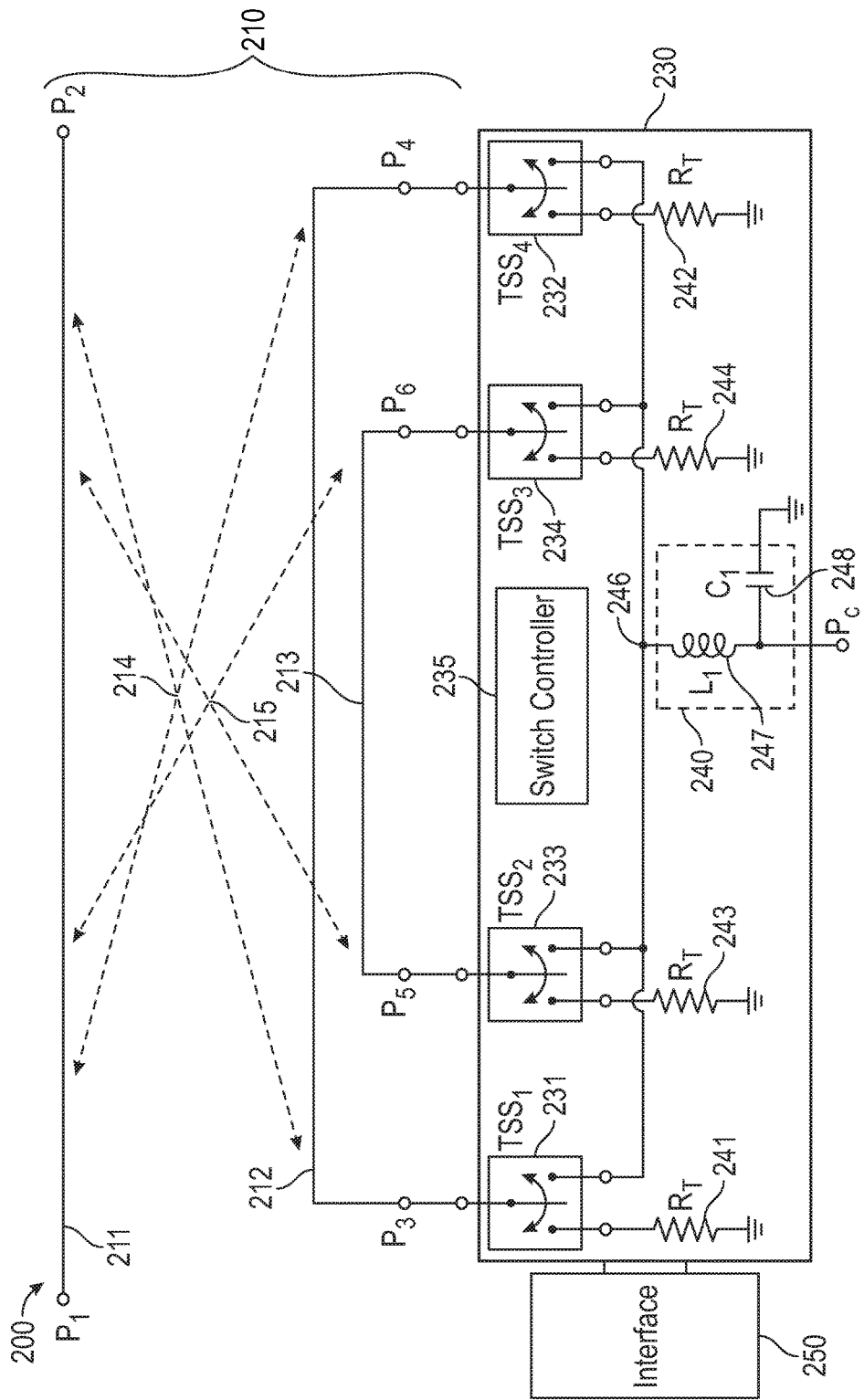
FIG. 2 is a simplified block diagram of a wideband directional coupler device, according to a representative embodiment.

FIG. 2 is a simplified block diagram of a wideband directional coupler device, according to a representative embodiment.

Referring to FIG. 2, wideband directional coupler device 200 includes an asymmetric dual directional coupler 210, a switching circuit (coupling switching stage) 230 and an interface 250. In an embodiment, the directional coupler 210, the switching circuit 230 and the interface 250 may be part of the same integrated circuit (IC). For example, the directional coupler 210 may be formed using a silicon-on-insulator (SOI) complementary metal-oxide-semiconductor (CMOS) process.

Because the SOI-CMOS process is widely used for low-loss and high-isolation antenna switches, it is advantageous for integration with the front-end stage.

The directional coupler 210 of the wideband directional coupler device 200 is located between the front-end stage (not shown) and an antenna (not shown) of a wireless communications device. For single-band configurations, the front-end stage may include a power amplifier, e.g., a monolithic microwave integrated circuit (MMIC) power amplifier, and a matching network, where the directional coupler 210 may be coupled between the matching network and the antenna. For wideband configurations, including multi-band configurations discussed above, the front-end stage may include a power amplifiers, e.g., a MMIC power amplifier, a matching network, a band selection switch and a band pass filter for each band, and an antenna switch for selecting one of the bands to connect to the antenna, where the directional coupler 210 may be coupled between the antenna switch and the antenna.

The directional coupler 210 includes a main line (or through-line) 211, a first coupled line 212 and a second coupled line 213. The main line 211 is a transmission line having an input port $P_1$ for receiving a radio frequency (RF) signal, e.g., from a front-end stage, and an output (or transmitted) port $P_2$ for outputting the RF signal, e.g., to an antenna. The first coupled line 212 has corresponding first and second ports $P_3$ and $P_4$, and the second coupled line 213 has corresponding first and second ports $P_5$ and $P_6$. The first and second coupled lines 212 and 213 are asymmetric in that they have different physical dimension and different electrical lengths, and therefore different coupling factors, respectively. In particular, the second coupled line 213 is shorter than the first coupled line 212 in the depicted embodiment. Of course, the main line 211 may have input port $P_1$ for receiving a RF signal, e.g., from the antenna, and output port $P_2$ for outputting the RF signal, e.g., to the front-end stage, without departing from the scope of the present teachings.

The dashed arrows 214 indicate the dual directional coupling effects between the main line 211 and the first coupled line 212, and the dashed arrows 215 indicate the dual directional (forward and reverse) coupling effects between the main line 211 and the first coupled line 212, e.g., for coupling a portion of power of the RF signal in the main line 211 to a coupling reading port $P_C$. Referring to the first coupled line 212, when reading forward power, the first port $P_3$ is the coupled port and the second port $P_4$ is the isolated port, and when reading reverse power, the first port $P_3$ is the isolated port and the second port $P_4$ is the coupled port. Similarly, referring to the second coupled line 213, when reading forward power, the first port $P_5$ is the coupled port and the second port $P_6$ is the isolated port, and when reading reverse power, the first port $P_5$ is the isolated port and the second port $P_4$ is the coupled port.

The switching circuit 230 is connectable to the directional coupler 210 through the first and second ports $P_3$ and $P_4$ of the first coupled line 212 and the first and second ports $P_5$ and $P_6$ of the second coupled line 213. The switching circuit 230 is configured to connect one of the first coupled line 212 and the second coupled line 213 between a termination resistance and the coupling reading port $P_C$, depending in part on the frequency of the RF signal, for reading forward or reverse power. That is, when the frequency of the RF signal lower than a predetermined transition frequency fp, the switching circuit 230 selects the (longer) first coupled line 212, and when the frequency of the RF signal higher than the predetermined transition frequency fp, the switching circuit 230 selects the (shorter) second coupled line 213. The second coupled line 213 mitigates excessive power loss in the higher frequency range, while satisfying the coupling criteria, which enlarges the applicable frequency range serviced by the directional coupler 210. In comparison, use of the first coupled line 212 would result in excessive power loss in the higher frequency range due to strong coupling.

The switching circuit 230 includes multiple tristate switches that are operated, e.g., under control of (internal) switch controller (or decoder) 235 in response to commands from the interface 250, to selectively connect one of the first coupled line 212 or the second coupled line 213 for coupling with the main line 211, and to select one of forward or reverse power measurement. That is, a tristate switch (TSS) is located at each port of the first and second coupled lines 212 and 213 (first and second ports $P_3$ and $P_4$ and the first and second ports $P_5$ and $P_6$), which control the first and second coupled lines 212 and 213 to be selectively coupled and decoupled.

In particular, the switching circuit 230 includes first tristate switch 231, second tristate switch 232, third tristate switch 233 and fourth tristate switch 234 connected to the switch controller 235 by wired or wireless connections (not shown). Each of the first to fourth tristate switches 231-234 has a terminated state (T), a reading state (R) and a floating state (F), and is switched into one of these three states under control of the switch controller 235, as mentioned above. The terminated state connects the first tristate switch 231, the second tristate switch 232, the third tristate switch 233 and the fourth tristate switch 234 to ground through first resistance 241, second resistance 242, third resistance 243 and fourth resistance 244, respectively. The reading state connects the first tristate switch 231, the second tristate switch 232, the third tristate switch 233 and the fourth tristate switch 234 to the coupling reading port $P_C$ through a coupling matching network 240. The floating state disconnects the first tristate switch 231, the second tristate switch 232, the third tristate switch 233 and the fourth tristate switch 234, thus creating open circuit. For optimal termination of the first and second coupled lines 212 and 213, the value of the first to fourth resistances 241-244 may be 48Ω in this example, considering equivalent resistances of the first to fourth tristate switches 231-234 and their routing lines, although the resistance values may vary to provide unique benefits for any particular situation or to meet application specific design requirements of various implementations, as would be apparent to one skilled in the art.

The interface 250 sets the states of the first to fourth tristate switches 231-234 depending on the relationship between the pre-determined transition frequency (fp) and the frequency of the RF signal, and the desired direction of power measurement (forward or reverse). As discussed above, when the frequency is lower than the predetermined transition frequency fp, the first to fourth tristate switches 231-234 are configured to select the first (longer) coupled line 212, and when the frequency is higher than the predetermined transition frequency fp, the first to fourth tristate switches 231-234 are configured to select the second (shorter) coupled line 213.

When the first coupled line 212 has been selected, setting the first tristate switch 231 in the reading state and the second tristate switch 232 in the terminated state enables reading of the forward power, and setting the first tristate switch 231 in the terminated state and the second tristate switch 232 in the reading state enables reading of the reverse power through the directional coupler 210. The other two tristate switches (233, 234) are in the floating state. When the second coupled line 213 has been selected, setting the third tristate switch 233 in the reading state and the fourth tristate switch 234 in the terminated state enables reading of the forward power, and setting the third tristate switch 233 in the terminated state and the fourth tristate switch 234 in the reading state enables reading of the reverse power through the directional coupler 210. The other two tristate switches (231, 232) are in the floating state.

Control of the first to fourth tristate switches 231-234 may be accomplished initially using two control bits, for example, first control bit CTRL1 and second control bit CTRL2, output by the interface 250 to the switch controller 235, e.g., in response to manual input by a user or other control input. In an embodiment, the interface 250 may be a baseband chipset and/or a control interface such as MIPI RF front-end (RFFE) control interface, for example. Each of the first control bit CTRL1 and the second control bit CTRL2 may be set to a low value (0) or a high value (1), for example, depending on user or other input through the interface 250. Other types of interfaces may be incorporated without departing from the scope of the present teachings. The first and second control bits CTRL1 and CTRL2 are provided to the switch controller 235, which in an embodiment, may output two voltages $V_T$ and $V_R$ in response, for example. The voltages $V_T$ and $V_R$ may be used to control transistors in each of the first to fourth tristate switches 231-234 (discussed below with reference to Table II). The switch controller 235 may be a logic circuit or integrated decoder, for example.

Accordingly, operation of the switching circuit 230 may be classified into four modes, for example, mode-1F, mode-1R, mode-2F and mode-2R. The modes correspond to the frequency ranges divided by the predetermined transition frequency fp and the desired power to be read (forward or reverse), under control of the two control bits CTRL1 and CTRL2 output by the interface 250 (as well as the voltages $V_T$ and $V_R$ output by the switch controller 235 in response to the values of the first and second control bits CTRL1 and CTRL2). Table I summarizes the states of the first and second control bits CTRL1 and CTRL2 and of the first to fourth tristate switches 231-234 corresponding to each of the modes of the switching circuit 230:

TABLE I

| Mode | Freq. Range (GHz) | Reading Power | Control Bits CTRL1 | CTRL2 | State of Each TSS 231 | 232 | 233 | 234 |
|---|---|---|---|---|---|---|---|---|
| 1F | Lower | Forward | L | L | R | T | F | F |
| 1R | (0.69-fp) | Reverse | L | H | T | R | F | F |
| 2F | Upper | Forward | H | L | F | F | R | T |
| 2R | (fp-4.0) | Reverse | H | H | F | F | T | R |

In Table I, the total frequency range corresponds to the total frequency range of LTE (e.g., 0.69 GHz-4.00 GHz), for purposes of illustration only. It is understood that other frequency ranges and/or corresponding predetermined transition frequencies fp may be incorporated without departing from the scope of the present teachings. Also, in various embodiments, different numbers and/or values of control bits may be incorporated to obtain the states of each of the first to fourth tristate switches 231-234, without departing from the scope of the present teachings.

Referring to Table I, the switching circuit 230 operates in mode 1F, for example, when the frequency of the RF signal is within the lower range (e.g., 0.69 GHz-4.00 GHz, or at least lower than fp), the first control bit CTRL1 is low (0), and the second control bit CTRL2 is low (0). This causes the first tristate switch 231 to enter the reading state, the second tristate switch 232 to enter the terminated state, and the third and fourth tristate switches 233 and 234 to float, in which case the directional coupler 210 reads the forward power of an RF signal in the lower range. The switching circuit 230 operates in mode 2F, for example, when the frequency of the RF signal is within the upper range (e.g., fp-4.00 GHz, or at least higher than fp), the first control bit CTRL1 is high (1), and the second control bit CTRL2 is low (0). This causes the first and second tristate switches 231 and 232 to float, the third tristate switch 233 to enter the reading state, and the fourth tristate switch 234 to enter the terminated state, in which case the directional coupler 210 reads the forward power of the RF signal in the upper range. Table I similarly provides tristate switch settings for the switching circuit 230 to operate in modes 1R and 2R, where the directional coupler 210 reads the reverse power of the RF signal in the lower and upper frequency ranges, respectively.

The coupling matching network 240 is configured to compensate for parasitic capacitance from the first to fourth tristate switches 231-234. In the depicted embodiment, the matching network 240 includes an inductance 247 connected between coupling reading node 246 and the coupling reading port $P_C$, and a capacitance 248 connected between the coupling reading port $P_C$ and ground. For the LTE frequency range, for example, the value the inductance 247 may be approximately 2.4 nH and the value of the capacitance 248 may be about 0.4 pF and 2.4 nH, although the inductance and capacitance values may vary to provide unique benefits for any particular situation or to meet application specific design requirements of various implementations, as would be apparent to one skilled in the art. Further, the circuit structure of the coupling matching network 240 may vary, without departing from the scope of the present teachings. For example, the coupling matching network 240 is depicted as an illustrative single section L-C matching. However, other types of matching networks, such as a RC matching network or a two or more section matching network may be used as would be apparent to one skilled in the art.

As stated above, the switch controller 235 may be a logic circuit or integrated decoder. In alternative embodiments, the switch controller 235 may be implemented at least in part by a computer processor (e.g., of a personal computer (PC) or dedicated workstation), a microprocessor, application-specific integrated circuits (ASICs), field-programmable gate arrays (FPGAs), other forms of circuitry configured for this purpose, or combinations thereof, using software, firmware, hard-wired logic circuits, or combinations thereof. A computer processor, in particular, may be constructed of any combination of hardware, firmware or software architectures, and may include memory (e.g., volatile and/or non-volatile memory) for storing executable software/firmware executable code that allows it to perform the various functions.

The total power loss of the directional coupler 210 consists of through-line loss at the main line 211 and coupling loss at the coupling port (e.g., one of the first port $P_3$ or second port $P_4$ of the first coupled line 212, or one of the first port $P_5$ or second port $P_6$ of the second coupled line 213), which result from power dissipation inside the wideband directional coupler device 200 and power sampling at the coupling port, respectively. The practical through-line loss depends on the Q-factor of the process along the target frequency range, and the coupling loss increases exponentially with an increasing coupling factor, which increases with frequency.

Thus, at some frequency, the coupling loss becomes the primary cause of the excessive loss, which limits bandwidth. The coupling factor therefore should be reduced, for example, when the coupling loss exceeds a predetermined percentage threshold of the total power loss, which may be referred to as the maximum tolerable coupling factor. Above the percentage threshold, the total power loss is considered to be excessive. The percentage threshold may be 50 percent, for example, where the coupling loss exceeds half of the total power loss, although other percentage thresholds may be incorporated without departing from the scope of the present teachings. The point at which the coupling loss exceeds the percentage threshold can be translated to a specific frequency, which is the predetermined transition frequency fp. For example, it may be assumed for purposes of explanation that, when the through-line loss is −0.1 dB, the coupling loss accounts for half of the total power loss at a coupling factor of about −16.4 dB. Similarly, it may be assumed that when the through-line loss is −0.05 dB, the coupling loss accounts for half of the total power loss at a coupling factor of about −19.4 dB.

In this way, the maximum tolerable coupling factor can be defined per through-line loss, and then translated to a certain predetermined transition frequency fp of the directional coupler 210. Therefore, when the coupling factor is reduced to desired coupling criteria at the frequency range higher than the predetermined transition frequency fp, then the total power loss is reduced by the amount of the improvement in coupling loss, thereby extending the useful bandwidth.

Figure 3:
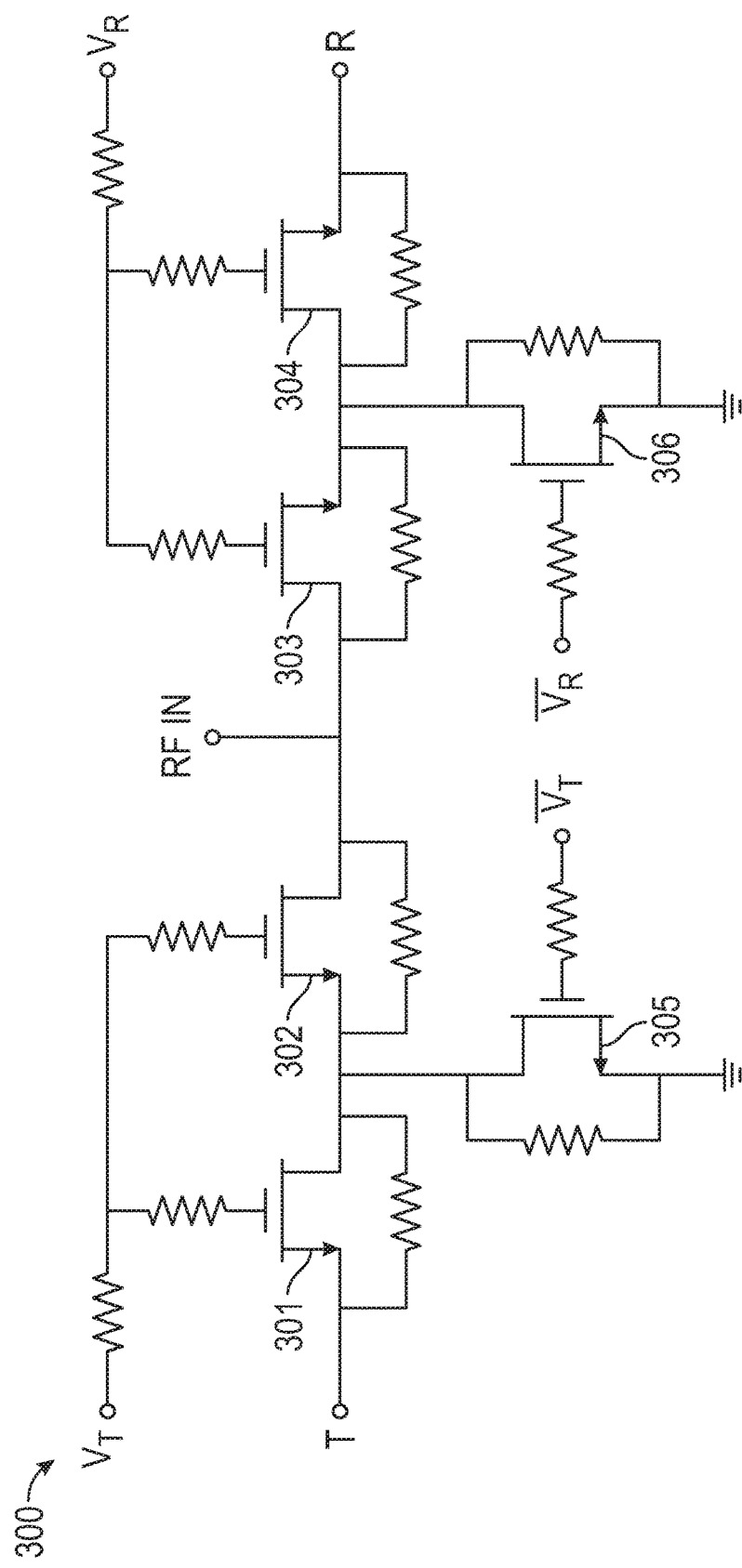
FIG. 3 is a simplified circuit diagram of an illustrative tristate switch in a wideband directional coupler device, according to a representative embodiment.

FIG. 3 is a simplified circuit diagram of a tristate switch in a wideband directional coupler device, according to a representative embodiment. It is understood that the first to fourth tristate switches 231-234 shown in FIG. 2 may be implemented by illustrative tristate switch 300 in FIG. 3, although other configurations of tristate switches may be incorporated without departing from the scope of the present teachings.

Referring to FIG. 3, the illustrative tristate switch 300 includes series stacked FETs 301, 302, 303 and 304, shunt field effect transistor (FET) 305 connected between ground and the FETs 301 and 302, and shunt FET 306 connected between ground and the FETs 303 and 304. The FETs 305 and 306 provide ground paths, and to achieve high port-to-port isolation in the target frequency range. The tristate switch 300 may be connected to one of the ports $P_3$, $P_4$, $P_5$ or $P_6$ of the first or second coupled lines 212 or 213 through input terminal RF IN. Also, the tristate switch 300 may be connected to one of the first to fourth resistances 241-244 through termination terminal T at the source of the FET 301, and may be connected to the coupling reading node 246 (which is coupled to the coupling reading port $P_C$) through read terminal R at the source of the FET 304.

The FETs 301 and 302 are controlled by termination voltage $V_T$ applied to the respective gates via corresponding resistances, and the FETs 303 and 304 are controlled by read voltage $V_R$ applied to the respective gates via corresponding resistances. The FET 305 is controlled by the inverse termination voltage $\overline{V_T}$ applied to its gate via a corresponding resistance, and the FET 306 is controlled by the inverse read voltage $\overline{V_R}$ applied to its gate via a corresponding resistance. Each of the termination voltage $V_T$ and the read voltage $V_R$ may vary between a high voltage level (H) of about 1.0-2.0 V DC and a low voltage level (L) of about 0, for example, although other voltage levels may be incorporated (as well as other transistor arrangements, as mentioned above), without departing from the scope of the present teachings.

The termination voltage $V_T$ and the read voltage $V_R$ are provided to the first to fourth tristate switches 231-234 by the switch controller 235 in response to the first and second control bits CTRL1 and CTRL2, thereby controlling the tristate operation of the first to fourth tristate switches 231-234 to the desired states. The operation logic for the illustrative tristate switch 300 is summarized in Table II:

TABLE II

| State | $V_T$ | $V_R$ | Description |
| --- | --- | --- | --- |
| T | H | L | Enable termination path |
| R | L | H | Enable reading path |
| F | L | L | Floating state |

Although the transistors (FETs 301-306) are depicted as FETs for purposes of explanation, other types of transistors, including various types of FETs, may be incorporated, without departing from the scope of the present teachings. Examples of other types of transistors include a gallium-arsenide FET (GaAs FET), a gallium nitride FET (GaN FET), a metal-oxide semiconductor FET (MOSFET) or a heterostructure FET (HFET), a high electron mobility transistor (HEMT), a pseudomorphic HEMT (pHEMT), a gallium nitride HEMT (GaN HEMT) and a bipolar junction transistor (BJT).

Figure 4:
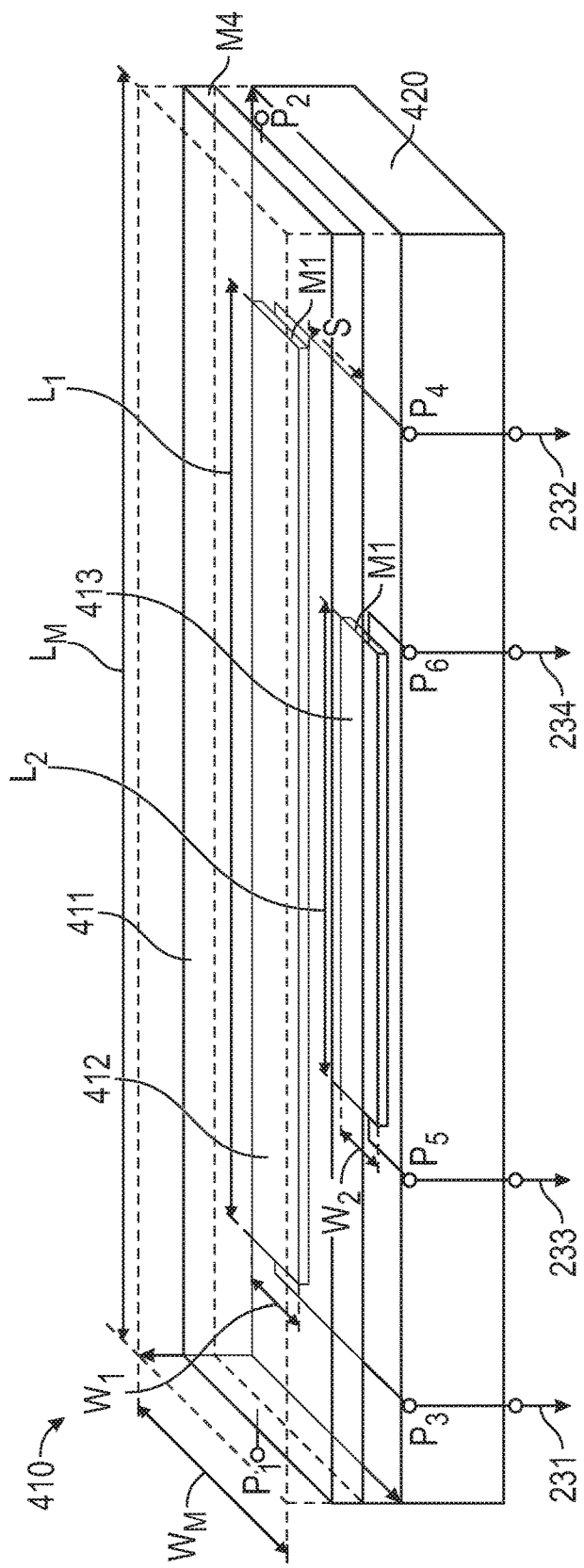
FIG. 4 is a top perspective view of an asymmetric dual directional coupler, according to a representative embodiment.

FIG. 4 is a top perspective view of an asymmetric dual directional coupler, according to a representative embodiment. Portions of the directional coupler are transparent to show the orientation of various components with respect to one another. Not all layers and other components that may be present in the directional coupler are depicted in FIG. 4 for the sake of clarity.

Referring to FIG. 4, an asymmetric dual directional coupler 410 substantially corresponds to the directional coupler 110 discussed above with reference to FIG. 1, showing an illustrative configuration thereof. In the depicted embodiment, the directional coupler 410 includes multiple metal layers (e.g., M1, M2, M3 and M4), in a dielectric material separating the multiple metal layers, formed over a substrate 420, although only portions of first metal layer M1 and second metal layer M4 are shown for the sake of clarity. The dielectric material may have a permittivity c of about 4.2, for example, and any compatible dielectric material may be incorporated. The substrate 420 may be formed of any material compatible with the semiconductor process, such as silicon (Si) or silicon on insulator (SOI), for example. When the substrate 420 is an SOI substrate, the insulating material between layers of Si may be silicon dioxide ($SiO_2$) or sapphire, for example. The SOI substrate therefore has high resistivity for low-loss characteristic. Of course, other substrate materials may be incorporated without departing from the scope of the present teaches.

In the depicted embodiment, the directional coupler 410 includes a main line (or through-line) 411 formed in the fourth metal layer M4 (e.g., top most metal layer), and a first coupled line 412 and a second coupled line 413 formed in the first metal layer M1 (e.g., bottom most metal layer). The fourth metal layer M4 may be formed of aluminum (Al), e.g., approximately 2.81 μm thick, and the first metal layer M1 may be formed of copper (Cu), e.g., approximately 0.33 μm thick, for example. Generally, the main line 411 should be implemented on the thickest metal layer for low-loss. Of course, other metal layer materials and/or thicknesses may be incorporated without departing from the scope of the present teaches.

In the example, second and third metal layers M2 and M3 are formed between the first metal layer M1 and the fourth metal layer M4 within the dielectric material, and may include aluminum (Al) and/or copper (Cu), for example. Alternative embodiments may include more or fewer than four metal layers, without departing from the scope of the present teachings. FIG. 8B, for example, depicts an embodiment in which the directional couple may include at least one metal layer, discussed below.

The main line 411 has an input port $P_1$ for receiving an RF signal, e.g., from a front-end stage, and an output port $P_2$ for outputting the RF signal, e.g., to an antenna. The first coupled line 412 has corresponding first and second ports $P_3$ and $P_4$, and the second coupled line 413 has corresponding first and second ports $P_5$ and $P_6$. The first and second ports $P_3$ and $P_4$ of the first coupled line 412, and the first and second ports $P_5$ and $P_6$ of the second coupled line 413, are coupled to the a switching circuit, such as the switching circuit 230 discussed above reference to FIG. 1. For example, the first and second ports $P_3$ and $P_4$ may be connected to first and second tristate switches 231 and 232, respectively, and the first and second ports $P_5$ and $P_6$ may be connected to third and fourth tristate switches 233 and 234, respectively. The first coupled line 412 and the second coupled line 413 are asymmetric in that they have different electrical lengths and provide different coupling factors. In particular, the second coupled line 413 is shorter than the first coupled line 412.

In the depicted embodiment, each of the first coupled line 412 and the second coupled line 413 broadside couple (as opposed to edge coupled) with the main line 411, when selected. That is, since the first and second coupled lines 412 and 413 are on a different layer than the main line 411, the (top) wide flat surfaces of the first and second coupled lines 412 and 413 face the (bottom) wide flat surface of the main line 411, enabling broadside coupling. Accordingly, the two different coupling factors of the asymmetric first and second coupled lines 412 and 413 do not affect the physical structure of the main line 411 due to broadside coupling. For example, the length of the main line 411 is not affected by the additional coupled line (as compared to the single coupled line in a conventional directional coupler), and the additional coupled line does not require additional semiconductor area because of the multi-layered structure. Thus, the first and second coupled lines 412 and 413 do not result in additional area requirements or through-line losses. Optimum performance of the directional coupler 410 may be achieved by designing capacitive coupling coefficient and inductive coupling coefficient to be equal.

Referring again to FIG. 4, main design parameters are the widths and lengths of the main line 411 (indicated as WM and LM), and the widths and lengths of the first and second coupled lines 412 and 413 (indicated as W1 and L1, and W2 and L2, respectively). This is partly because the usable metal layers for a coupler core are limited on basic back-end-of-line (BEOL) processes, and the vertical distance from the main line 411 to each of the first and second coupled lines 412 and 413 is difficult to use as a main design parameter in practical applications.

The unused (floating) one of the first and second coupled lines 412 and 413 within a certain frequency range must be decoupled from the main line 411 to prevent additional coupling loss. In a frequency range lower than the predetermined operational frequency fp, the first coupled line 412 is coupled to the main line 411 (e.g., one of the first and second ports $P_3$ and $P_4$ is in a terminated state and the other is in a reading state), while the second coupled line 413 is decoupled (e.g., the first and second ports $P_5$ and $P_6$ are in a floating state). Similarly, in an upper frequency range higher than the predetermined operational frequency fp, the second coupled line 412 is coupled to the main line 411, while the first coupled line 413 is decoupled.

Figure 5A:
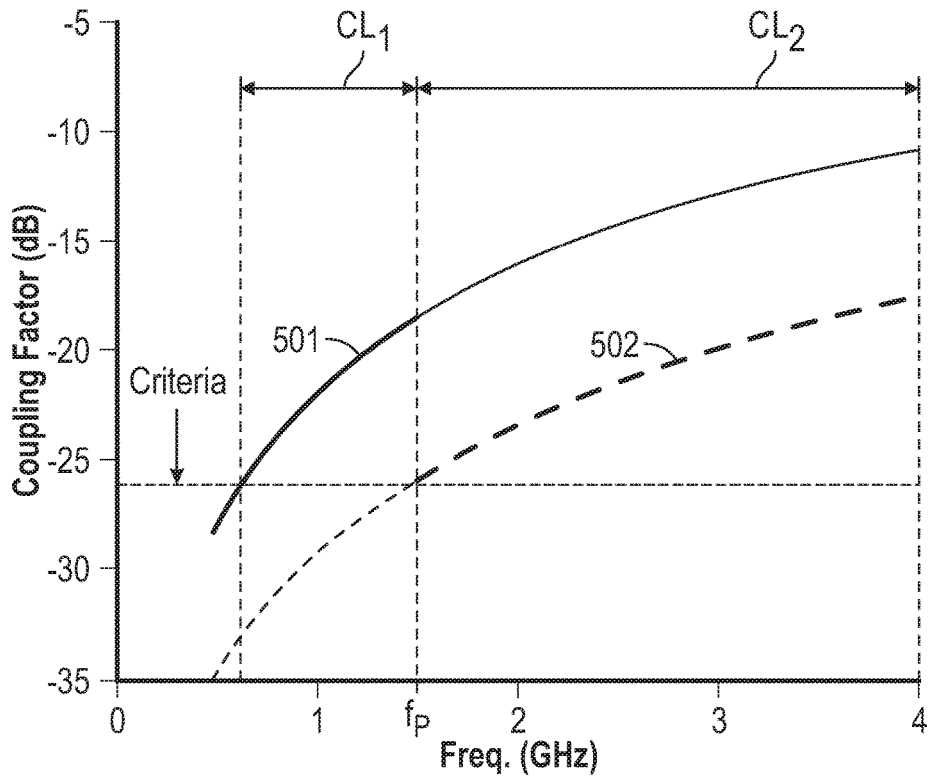
FIG. 5A is a graph showing an example of coupling factor of the asymmetric dual directional coupler in FIG. 4, according to a representative embodiment.
Figure 5B:
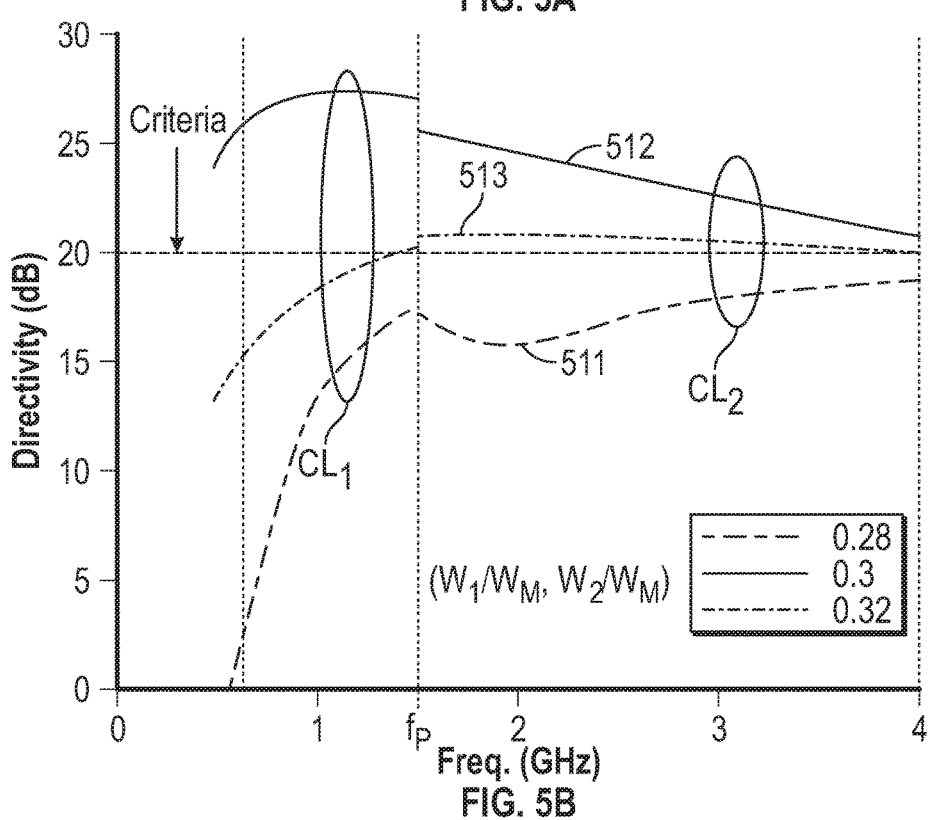
FIG. 5B is a graph showing an example of directivity of the asymmetric dual directional coupler in FIG. 4, according to a representative embodiment.

FIGS. 5A and 5B are graphs showing examples of coupling factor and directivity of the asymmetric dual directional coupler including the directional coupler 410 in FIG. 4, according to a representative embodiment. The graphs in FIGS. 5A and 5B assume ideal operation, for purposes of explanation.

In FIG. 5A, trace 501 indicates the coupling factor (in dB) of the first coupled line 412 and trace 502 indicates the coupling factor of the second coupled line 413, where the coupling criteria indicates a sufficient coupling factor (over −26 dB). In FIG. 5B, traces 511, 512 and 513 indicate directivity (in dB) of the directional coupler 410 for different width ratios W1/WM and W2/WM, discussed below, where the criteria indicates sufficient directivity (over 20 dB). In both FIGS. 5A and 5B, CL1 corresponds to selection of the first coupled line 412 and CL2 corresponds to selection of the second coupled line 413. In FIG. 5B, CL1 indicates the portion of the traces 511, 512 and 513 determined by selection of the first coupled line 412 is selected, and CL2 indicates the portion of the traces 511, 512 and 513 determined by selection of the second coupled line 413.

Generally, the coupling strength is determined by the lengths L1 and L2 of the first and second coupled lines 412 and 413. In the example, the length L1 may be determined to be 935 μm and the length L2 may be determined to be 400 μm, exhibiting two different coupling factors, as shown by traces 501 and 502 in FIG. 5A corresponding to the first coupled line 412 and the second coupled line 413. The first and second coupled lines 412 and 413 may be used as the lower and upper frequencies of the predetermined operational frequency fp, respectively (the bold portions of solid trace 501 and dashed trace 502, respectively).

In this example, the width WM of the main line may be determined to be 50 μm by considering resistive loss. The directivity is determined from the width ratio of the coupled one of the first and second coupled lines 412 and 413 to the main line 411 (W1/WM and W2/WM, respectively). Referring FIG. 5B, trace 511 indicates directivity for the width ratio of 0.28, trace 512 indicates directivity for the width ratio of 0.30, and trace 513 indicates directivity for the width ratio of 0.32. The best directivity is shown by trace 512, indicating that both width ratios (W1/WM and W2/WM) are optimized as 0.3, in this particular example, showing sufficient directivity of greater than 20 dB over the entire frequency range. In addition, the lateral spacing between the first and second coupled lines 412 and 413 may be up to 20 μm with a ratio of 0.3, which is sufficient to avoid interference between the first and second coupled lines 412 and 413.

Figure 6A:
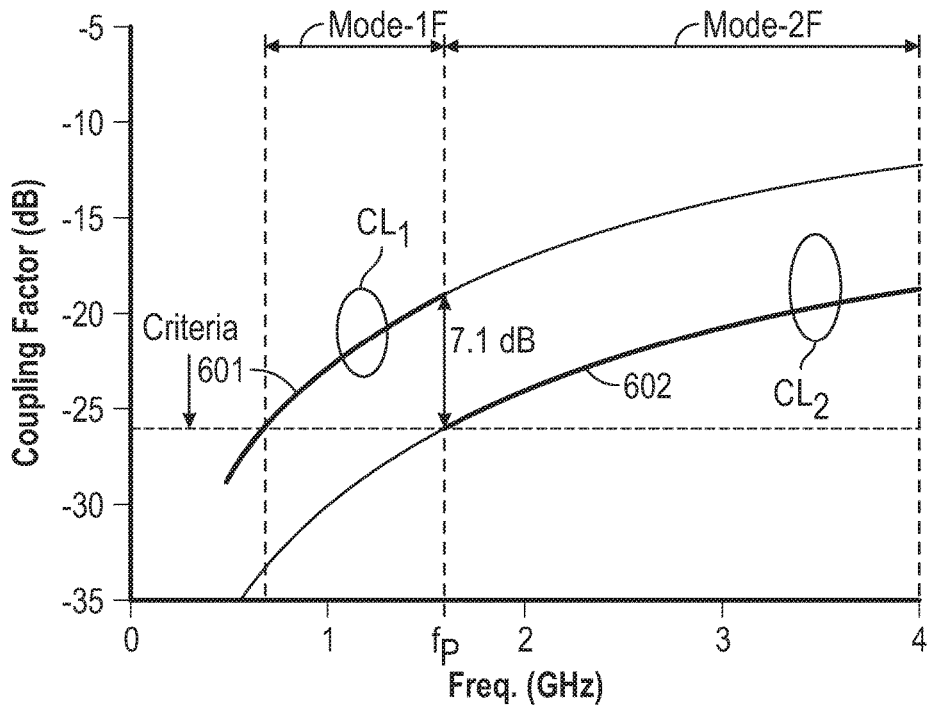
FIG. 6A is a graph showing an example of coupling factor of the asymmetric dual directional coupler in FIG. 4 over a broad frequency range, according to a representative embodiment.
Figure 6B:
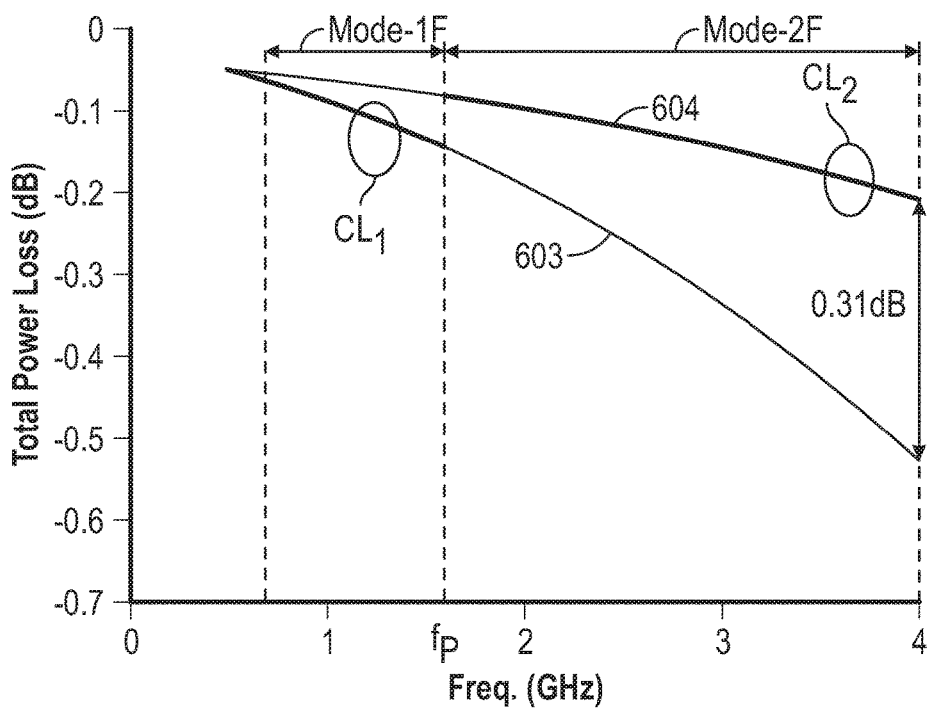
FIG. 6B is a graph showing an example of total power loss of the asymmetric dual directional coupler in FIG. 4 over a broad frequency range, according to a representative embodiment.

FIG. 6A is a graph showing coupling factor of the directional coupler in FIG. 4 over a broad frequency range, and FIG. 6B is a graph showing total power loss of the directional coupler in FIG. 4 over a broad frequency range, according to a representative embodiment.

Trace 601 in FIG. 6A shows the coupling factor (in dB) provided by the first coupled line 412, and trace 602 shows the coupling factor provided by the second coupled line 413. Each of the traces 601 and 602 increase proportionally with the frequency of the RF signal according to the first and second coupling factors, respectively. At the predetermined transition frequency fp, the directional coupler 410 switches from the first coupling factor provided by the first coupled line 412 to the second coupling factor provided by the second coupled line 413, indicated by the bold portions of traces 601 and 602. For purposes of illustration, the bold portion of trace 601 corresponds to mode-1F and the bold portion of trace 602 corresponds to mode-2F of the directional coupler 410. Notably, when the directional coupler 410 switches from the first coupled line 412 to the second coupled line 413 at the predetermined transition frequency fp, the coupling factor drops by about 7.1 dB, reducing the strength of the coupling with dropping below the coupling criteria.

Trace 603 in FIG. 6B shows the total power loss (in dB) provided by the first coupled line 412, and trace 604 shows the total power loss provided by the second coupled line 413. Each of the traces 603 and 604 increase proportionally with the frequency of the RF signal according to the first and second coupling factors, respectively. At the predetermined transition frequency fp, the directional coupler 410 switches from the first coupling factor provided by the first coupled line 412 to the second coupling factor provided by the second coupled line 413, indicated by the bold portions of traces 603 and 604. Notably, when the directional coupler 410 switches from the first coupled line 412 to the second coupled line 413 at the predetermined transition frequency fp, the total power loss decreases by about 0.31 dB, keeping directional coupler 410 from experiencing excessive power loss, e.g., since the coupling strength is lower as shown in FIG. 6A. In this way, the directional coupler 410 is able to maintain acceptably low total power loss over a wider frequency range. In this example, the directional coupler 410 effectively covers the frequency band for LTE with low power loss of less than −0.21 dB in the upper frequency range.

FIG. 7A is a simplified top plan view of an asymmetric dual directional coupler, according to a representative embodiment. FIG. 7B is a simplified cross-sectional view taken along line A-A' of the asymmetric dual directional coupler in FIG. 7A, according to the representative embodiment.

Referring to FIGS. 7A and 7B, asymmetric dual directional coupler 710 includes main line 711, first coupled line 712 and second coupled line 713, where the main line 711 is formed in a different metal layer than the metal layer in which the first and second coupled lines 712 and 713 are formed for broadside coupling (similar to the configuration of the asymmetric dual directional coupler 410 shown in FIG. 4). Thus, the bottom surface of the main line 711 faces the top surfaces of each of the first and second coupled lines 712 and 713. Notably, the first and second coupled lines 712 and 713 are shown using dashed lines in FIG. 7A to indicate they are positioned below the main line 711 (consistent with FIG. 7B). The metal layer containing the main line 711 and the metal layer containing the first and second coupled lines 712 and 713 are separated by at least one insulating layer and may be further separated by at least one additional metal layer. The metal and insulating layers are formed over the substrate 420, where the metal layer containing the first and second coupled lines 712 and 713 may be separated from the substrate 420 by at least one additional insulating layer and at least one additional metal layer.

The main line 711 has an input port $P_1$ for receiving an RF signal, e.g., from a front-end stage, and an output port $P_2$ for outputting the RF signal, e.g., to an antenna. The first coupled line 712 has first and second ports $P_3$ and $P_4$, and the second coupled line 713 has corresponding first and second ports $P_5$ and $P_6$. Each of the ports connect to a corresponding tristate switch (not shown), as discussed above. The first and second coupled lines 712 and 713 are asymmetric in that they have different electrical lengths, and therefore different coupling factors respectively.

FIG. 8A is a simplified top plan view of an asymmetric dual directional coupler, according to a representative embodiment. FIG. 8B is a simplified cross-sectional view taken along line B-B' of the asymmetric dual directional coupler in FIG. 8A, according to the representative embodiment.

Referring to FIGS. 8A and 8B, asymmetric dual directional coupler 810 includes main line 811, first coupled line 812 and second coupled line 813, where the main line 811 is formed in the same metal layer as the first and second coupled lines 812 and 813 for edge coupling. Thus, the lengthwise edges of the main line 811 face the inside lengthwise edges of the first and second coupled lines 812 and 813, respectively. This arrangement may use less metal than the arrangement shown in FIGS. 7A and 7B since only one metal layers is needed, although the arrangement shown in FIGS. 7A and 7B may use a smaller form factor. The first and second coupled lines 812 and 813 are separated horizontally from the main line 811 by insulating material partitioning the metal layer. The metal layer containing the main line 811 and the first and second coupled lines 812 and 813 is formed over the substrate 420, where the metal layer may be separated from the substrate 420 by at least one insulating layer and at least one additional metal layer.

The main line 811 has an input port $P_1$ for receiving an RF signal, e.g., from a front-end stage, and an output port $P_2$ for outputting the RF signal, e.g., to an antenna. The first coupled line 812 has first and second ports $P_3$ and $P_4$, and the second coupled line 813 has corresponding first and second ports $P_5$ and $P_6$. Each of the ports connect to a corresponding tristate switch (not shown), as discussed above. The first and second coupled lines 812 and 813 are asymmetric in that they have different electrical lengths, and therefore different coupling factors respectively.

Figure 9:
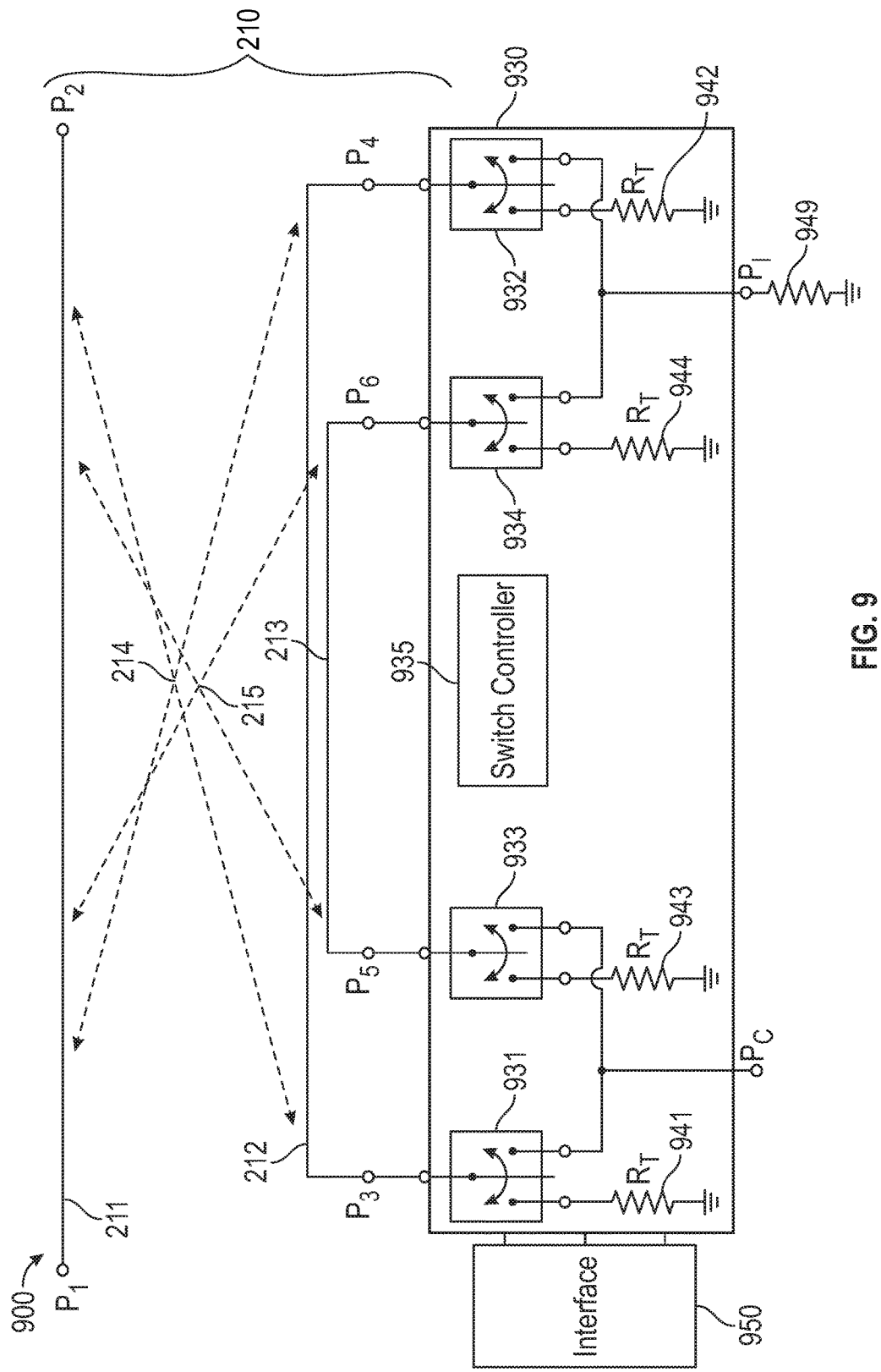
FIG. 9 is a simplified block diagram of a wideband directional coupler device, where the corresponding switching circuit enables daisy chaining, according to a representative embodiment.

In various embodiments, a wideband directional coupler device may operate in conjunction with other directional coupler device(s) by daisy chaining. Daisy chaining enables power to be coupled from multiple RF signal sources, such as multiple transmitters, for example. FIG. 9 is a simplified block diagram of a wideband directional coupler device that enables daisy chaining, according to a representative embodiment.

Referring to FIG. 9, wideband directional coupler device 900 includes an asymmetric dual directional coupler 210, a switching circuit (coupling switching stage) 930 and an interface 950. In an embodiment, the directional coupler 210, the switching circuit 930 and the interface 950 may be part of the same IC, as discussed above with reference to FIG. 2. The interface 950 is substantially the same as the interface 250, discussed above, except that it is programmed or otherwise configured to output three control bits, for example, as opposed to two control bits, depending on the relationship between the pre-determined transition frequency (fp) and the frequency of the RF signal, the desired direction of power measurement (forward or reverse), and whether the wideband directional coupler device 900 is daisy chained with other devices.

The directional coupler 210 of the wideband directional coupler device 900 is located between the front-end stage (not shown) and an antenna (not shown) of a wireless communications device. As discussed above, the directional coupler 210 includes a main line (or through-line) 211, a first coupled line 212 and a second coupled line 213. The main line 211 is a transmission line having an input port $P_1$ for receiving an RF signal, output port $P_2$ for outputting the RF signal. The first coupled line 212 has corresponding first and second ports $P_3$ and $P_4$, and the second coupled line 213 has corresponding first and second ports $P_5$ and $P_6$. The first and second coupled lines 212 and 213 are asymmetric in that they have different physical dimension and different electrical lengths, and therefore different coupling factors, respectively. The dashed arrows 214 indicate the dual directional coupling effects between the main line 211 and the first coupled line 212, and the dashed arrows 215 indicate the dual directional (forward and reverse) coupling effects between the main line 211 and the first coupled line 212, e.g., for coupling a portion of power of the RF signal in the main line 211 to a coupling reading port $P_C$.

The switching circuit 930 is connectable to the directional coupler 210 through the first and second ports $P_3$ and $P_4$ of the first coupled line 212 and the first and second ports $P_5$ and $P_6$ of the second coupled line 213. The switching circuit 930 is configured to connect one of the first coupled line 212 and the second coupled line 213 between a termination resistance and the coupling reading port $P_C$, depending in part on the frequency of the RF signal, for reading forward or reverse power. That is, when the frequency of the RF signal lower than a predetermined transition frequency fp, the switching circuit 930 selects the (longer) first coupled line 212, and when the frequency of the RF signal higher than the predetermined transition frequency fp, the switching circuit 930 selects the (shorter) second coupled line 213, as discussed above with reference to the switching circuit 230.

The switching circuit 930 includes multiple tristate switches that are operated, e.g., under control of (internal) switch controller (or decoder) 935 in response to commands from the interface 950, to selectively connect one of the first coupled line 212 or the second coupled line 213 for coupling with the main line 211, and to select one of forward or reverse power measurement. That is, a tristate switch (TSS) is located at each port of the first and second coupled lines 212 and 213 (first and second ports $P_3$ and $P_4$ and the first and second ports $P_5$ and $P_6$), which control the first and second coupled lines 212 and 213 to be selectively coupled and decoupled.

In particular, the switching circuit 930 includes first tristate switch 931, second tristate switch 932, third tristate switch 933 and fourth tristate switch 934 connected to the switch controller 935 by wired or wireless connections (not shown). Each of the first to fourth tristate switches 931-934 may be implemented using the illustrative tristate switch 300 discussed above with reference to FIG. 3, although other configurations of the first to fourth tristate switches 931-934 may be implemented, without departing from the scope of the present teachings.

Each of the first to fourth tristate switches 931-934 has a terminated state (T), a reading state (R) and a floating state (F), and is switched into one of these three states under control of the switch controller 935, as mentioned above. The terminated state connects the first tristate switch 931, the second tristate switch 932, the third tristate switch 933 and the fourth tristate switch 934 to ground through first resistance 941, second resistance 942, third resistance 943 and fourth resistance 944, respectively. Because the switching circuit 930 has its own termination resistors (first to forth resistances 941-944), the switching circuit 930 may be used for both stand-alone applications (without an external resistor, such as external termination resistance 949) and daisy chained applications with an external resistor, discussed below. For example, in daisy chained applications the first to fourth tristate switches 931-934 may be configured to electrically couple one of the first coupled line 212 or the second coupled line 213 in series to coupled line(s) of other directional coupler device(s).

The reading state connects the first tristate switch 931 and the third tristate switch 933 to the coupling reading port $P_C$, and connects the second tristate switch 932 and the fourth tristate switch 934 to the isolation port $P_I$. The isolation port $P_I$ is connected to ground through external termination resistance 949. The floating state disconnects the first tristate switch 931, the second tristate switch 932, the third tristate switch 933 and the fourth tristate switch 934, thus creating open circuit. The resistance values may vary to provide unique benefits for any particular situation or to meet application specific design requirements of various implementations, as would be apparent to one skilled in the art.

The interface 950 sets the states of the first to fourth tristate switches 931-934 depending on the relationship between the pre-determined transition frequency (fp) and the frequency of the RF signal, and the desired direction of power measurement (forward or reverse). The interface 950 also sets the states of the first to fourth tristate switches 931-934 in accordance with whether the wideband directional coupler device 900 is daisy-chained with one or more additional wideband directional coupler devices, as discussed below with reference to FIGS. 10A-10C. When the frequency is lower than the predetermined transition frequency fp, the first to fourth tristate switches 931-934 are configured to select the first (longer) coupled line 212, and when the frequency is higher than the predetermined transition frequency fp, the first to fourth tristate switches 931-934 are configured to select the second (shorter) coupled line 213.

When the first coupled line 912 has been selected, setting the first tristate switch 931 in the reading state and the second tristate switch 932 in the terminated state enables reading of the forward power, and setting the first tristate switch 931 in the terminated state and the second tristate switch 932 in the reading state enables reading of the reverse power through the directional coupler 210. The other two tristate switches (933, 934) are in the floating state. When the second coupled line 213 has been selected, setting the third tristate switch 933 in the reading state and the fourth tristate switch 934 in the terminated state enables reading of the forward power, and setting the third tristate switch 933 in the terminated state and the fourth tristate switch 934 in the reading state enables reading of the reverse power through the directional coupler 210. The other two tristate switches (931, 932) are in the floating state.

When the wideband directional coupler device 900 is daisy chained with one or more additional directional coupler devices, the switching circuit 930 may act as a "through" with respect the one or more additional directional coupler devices. That is, setting the first and second tristate switches 931 and 932 in the reading state and the third and fourth tristate switches 933 and 934 in the floating state enables a first through state via the first coupled line 212, and setting the third and fourth tristate switches 933 and 934 in the reading state and the first and second tristate switches 931 and 932 in the floating state enables a second through state via the second coupled line 213. In the through configurations, the isolation port $P_I$ is connected to a coupling reading port $P_C$ of a next directional coupler device in the chain (e.g., which may be another wideband directional coupler device or other type of directional coupler device) in order to read power of the daisy chained directional coupler devices with only one power detector (e.g., forward power and/or reverse power, depending on configuration of the daisy chain, as discussed below with reference to FIGS. 10B And 10C).

Control of the first to fourth tristate switches 931-934 may be accomplished initially using three control bits, for example, first control bit CTRL1, second control bit CTRL2 and third control bit CTRL3, output by the interface 950 to the switch controller 935, e.g., in response to manual input by a user or other control input. In an embodiment, the interface 950 may be a baseband chipset and/or a control interface such as MIPI RFFE control interface, for example. Each of the first control bit CTRL1, the second control bit CTRL2 and the third control bit CTRL3 may be set to a low value (0) or a high value (1), for example, depending on user or other input through the interface 950. Various types of interfaces may be incorporated without departing from the scope of the present teachings, as would be apparent to one of ordinary skill in the art.

The first, second and third control bits CTRL1, CTRL2 and CTRL3 are provided to the switch controller 935, which in an embodiment, may output two voltages $V_T$ and $V_R$ in response, for example. The voltages $V_T$ and $V_R$ may be used to control transistors in each of the first to fourth tristate switches 931-934 (discussed above with reference to Table II). The switch controller 935 may be a logic circuit or integrated decoder, for example.

Accordingly, operation of the switching circuit 930 may be classified into four coupling modes, for example, mode-1F, mode-1R, mode-2F and mode-2R, as discussed above, and two through modes, for example, Thru1 and Thru2. The through modes enable participation in a daisy chain of directional coupler devices. The coupling modes and/or through modes are selectively enabled under control of the three control bits CTRL1, CTRL2 and CTRL3 output by the interface 950 (as well as the voltages $V_T$ and $V_R$ output by the switch controller 935 in response to the values of the first, second and third control bits CTRL1, CTRL2 and CTRL3). Table III summarizes the states of the first, second and third control bits CTRL1, CTRL2 and CTRL3, and of the first to fourth tristate switches 931-934 corresponding to each of the coupling and through modes of the switching circuit 930:

TABLE III

| Mode | Freq. Range (GHz) | Reading Power | Control Bits | | | State of Each TSS | | | |
|---|---|---|---|---|---|---|---|---|---|
| | | | CTRL1 | CTRL2 | CTRL3 | 931 | 932 | 933 | 934 |
| 1F | Lower | Forward | L | L | L | R | T | F | F |
| 1R | (0.69-fp) | Reverse | L | H | L | T | R | F | F |
| 2F | Upper | Forward | H | L | L | F | F | R | T |
| 2R | (fp-4.0) | Reverse | H | H | L | F | F | T | R |
| Thru1 | Daisy-Chain | | L | L | H | R | R | F | F |
| Thru2 | Modes | | H | L | H | F | F | R | R |

In Table III, the total frequency range corresponds to the total frequency range of LTE (e.g., 0.69 GHz-4.00 GHz), for purposes of illustration only. It is understood that other frequency ranges and/or corresponding predetermined transition frequencies fp may be incorporated without departing from the scope of the present teachings. As compared to Table I, Table III shows an additional control bit, the third control bit CTRL3. The third control bit CTRL3 is used to indicate when the wideband directional coupler device 900 is in the through mode to accommodate daisy chaining. In various embodiments, different numbers and/or values of control bits may be incorporated to obtain the states of each of the first to fourth tristate switches 931-934, without departing from the scope of the present teachings.

Referring to Table III, the switching circuit 930 operates in mode 1F, for example, when the frequency of the RF signal is within the lower range (e.g., 0.69 GHz-4.00 GHz, or at least lower than fp), the first control bit CTRL1 is low (0), the second control bit CTRL2 is low (0) and the third control bit CTRL3 is low (0). This causes the first tristate switch 931 to enter the reading state, the second tristate switch 932 to enter the terminated state, and the third and fourth tristate switches 933 and 934 to float, in which case the directional coupler 210 reads the forward power of an RF signal in the lower range. The switching circuit 930 operates in mode 2F, for example, when the frequency of the RF signal is within the upper range (e.g., fp-4.00 GHz, or at least higher than fp), the first control bit CTRL1 is high (1), the second control bit CTRL2 is low (0), and the third control bit CTRL3 is low (0). This causes the first and second tristate switches 931 and 932 to float, the third tristate switch 933 to enter the reading state, and the fourth tristate switch 934 to enter the terminated state, in which case the directional coupler 210 reads the forward power of the RF signal in the upper range. Table III similarly provides tristate switch settings for the switching circuit 930 to operate in modes 1R and 2R, where the directional coupler 210 reads the reverse power of the RF signal in the lower and upper frequency ranges, respectively.

The switching circuit 930 operates in mode Thru1, for example, when the frequency of the RF signal is within the lower range or the higher range, the first control bit CTRL1 is low (0), the second control bit CTRL2 is low (0), and the third control bit CTRL3 is high (1). This causes the first and second tristate switches 931 and 932 to enter the reading state, and the third and fourth tristate switches 933 and 934 to float, in which case the first coupled line 212 acts as a through line for daisy chained directional coupler device(s). The switching circuit 930 operates in mode Thru2, for example, when the frequency of the RF signal is within the lower range or the higher range, the first control bit CTRL1 is high (1), the second control bit CTRL2 is low (0), and the third control bit CTRL3 is high (1). This causes the first and second tristate switches 931 and 932 to float, and the third and fourth tristate switches 933 and 934 to enter the reading state, in which case the second coupled line 213 acts as a through line for daisy chained directional coupler device(s).

Mode Thru1 and mode Thru2 provide electrical paths. For example, when another (similar) wideband directional coupler device is daisy chained with the wideband directional coupler device 900, mode Thru1 and/or mode Thru2 may be used for reading, even though the daisy chained wideband directional coupler device is not in a read mode. Also, the switching circuit 930 may use its own termination resistors, first to forth resistances 941-944, for termination in each of mode-1F, mode-1R, mode-2F and mode-2R, and also use external termination resistance 949 for termination in each of mode Thru1 and mode Thru2 (e.g., for daisy chaining, discussed below).

As stated above, the switch controller 935 may be a logic circuit or integrated decoder. In alternative embodiments, the switch controller 935 may be implemented at least in part by a computer processor (e.g., of a PC or dedicated workstation), a microprocessor, ASICs, FPGAs, other forms of circuitry configured for this purpose, or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions.

Figure 10B:
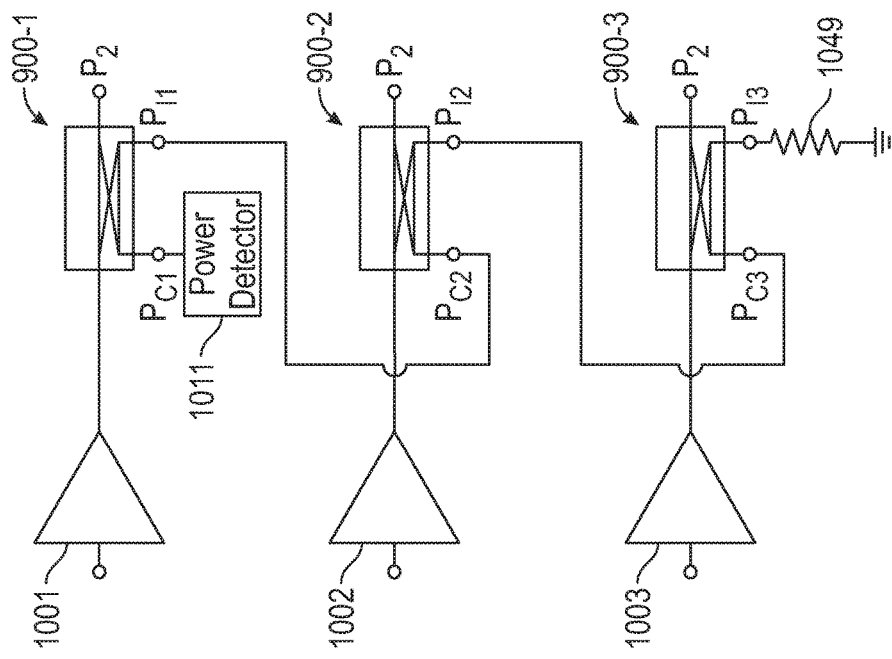
FIG. 10B is a simplified block diagram of multiple directional coupler devices reading power levels from multiple transmitters using daisy chaining for read coupling only, according to a representative embodiment.
Figure 10A:
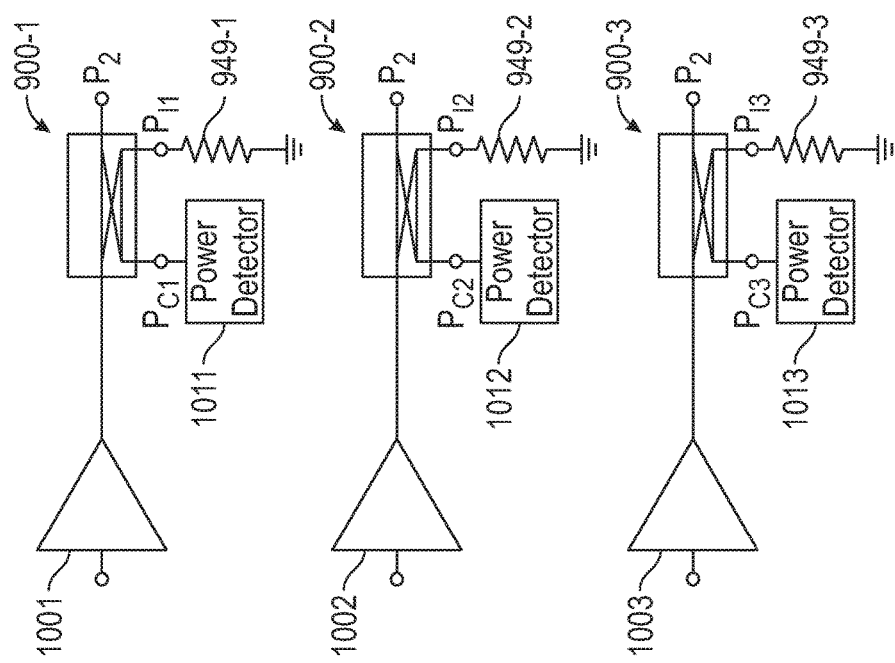
FIG. 10A is a simplified block diagram of multiple directional coupler devices reading power levels from multiple transmitters independently, according to a representative embodiment.
Figure 10C:
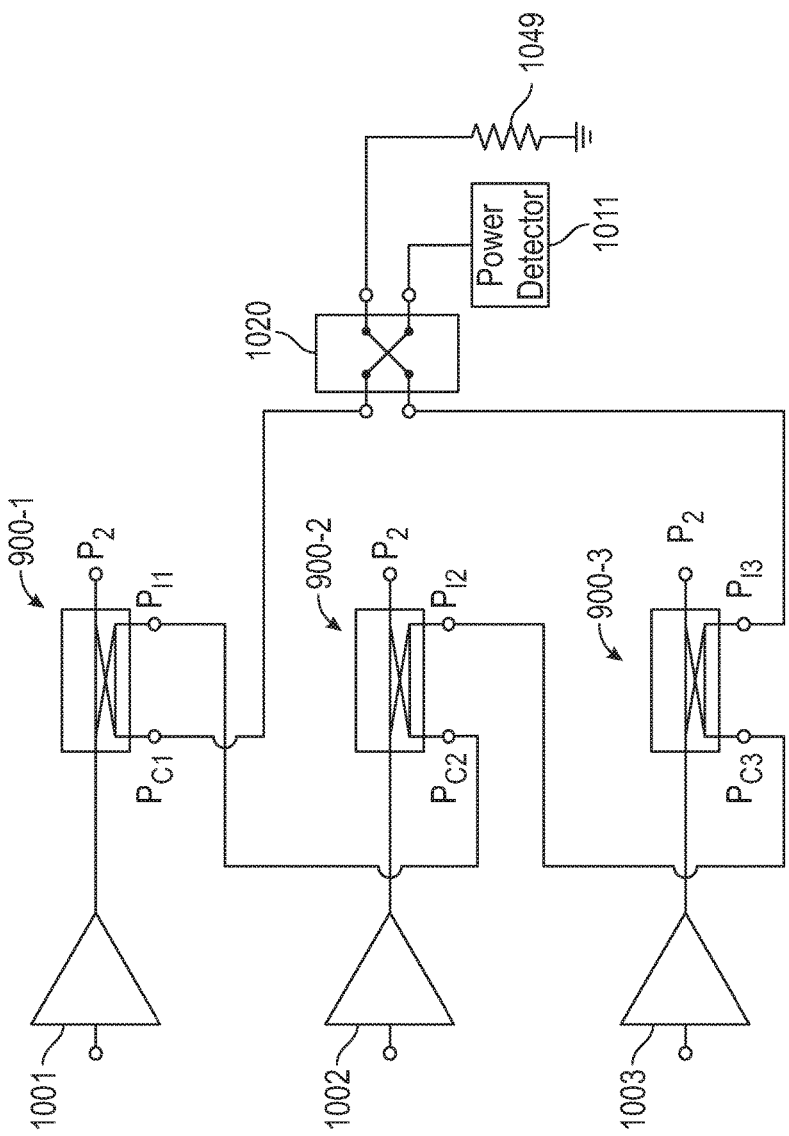
FIG. 10C is a simplified block diagram of multiple directional coupler devices reading power levels from multiple transmitters using daisy chaining for read coupling and isolation, according to a representative embodiment.

Multiple directional coupler devices, such as the wideband directional coupler device 900, may be used to read power levels from multiple RF signal sources, such as RF signals sent by transmitter(s) and/or RF signals received from antenna(s). Wireless communication devices, such as mobile phones, for example, may include such multiple wideband directional coupler devices. FIG. 10A is a simplified block diagram of multiple directional coupler devices reading power levels from multiple transmitters independently, according to a representative embodiment. FIG. 10B is a simplified block diagram of multiple directional coupler devices reading power levels from multiple transmitters using daisy chaining for read coupling only, according to a representative embodiment. FIG. 10C is a simplified block diagram of multiple directional coupler devices reading power levels from multiple transmitters using daisy chaining for read coupling and isolation, according to a representative embodiment. In each of FIGS. 10A-10C, the transmitters may include power amplifier modules (PAMs), for example, although it is understood that the coupling may be applied to RF signals from other types of transmitters, as well as to RF signals from antennas, without departing from the scope of the present teachings.

Referring to FIG. 10A, coupling of RF signals from three transmitters is performed by three direction couplers, respectively, with no daisy chaining. That is, read coupling is performed for a first transmitter 1001 by a first directional coupler device 900-1 (first asymmetric dual directional coupler device), where the coupling reading port $P_{C1}$ is connected to a first power detector 1011 and the isolation port $P_{I1}$ is connected to ground via external termination resistance 949-1. Read coupling is performed for a second transmitter 1002 by a second directional coupler device 900-2 (second asymmetric dual directional coupler device), where the coupling reading port $P_{C2}$ is connected to a second power detector 1012 and the isolation port $P_{I2}$ is connected to ground via external termination resistance 949-2. Read coupling is performed for a third transmitter 1003 by a third directional coupler device 900-3 (third asymmetric dual directional coupler device), where the coupling reading port $P_{C3}$ is connected to a third power detector 1013 and the isolation port $P_{I3}$ is connected to ground via external termination resistance 949-3. Each of the first to third power detectors 1011-1013 may be an external power sensing circuit or integrated circuit (IC), such as an inductive sensor, a resistance circuit, a log detector, a RMS detector, and/or a peak/envelope detector, for example, although other types of power detectors may be incorporated without departing from the scope of the present teachings.

Because there is no daisy chaining, the coupled power from each of the first to third directional coupler devices 900-1 to 900-3 must be detected by separate power detectors 1011-1013, respectively. In FIGS. 10A-10C, each of the first to third directional coupler devices 900-1 to 900-3 is substantially the same as the wideband directional coupler device 900, discussed above. However, it is understood that only one (or more) of the of the first to third directional coupler devices 900-1 to 900-3 may be substantially the same as the wideband directional coupler device 900 and still operate in accordance with the various embodiments.

Referring to FIG. 10B, coupling of RF signals from the three transmitters is performed by three direction couplers, respectively, that are daisy chained for reading forward power only. That is, read coupling of a first RF signal is performed for the first transmitter 1001 by the first directional coupler device 900-1, where the coupling reading port $P_{C1}$ is connected to the first power detector 1011 and the isolation port $P_{I1}$ is connected to the coupling reading port $P_{C2}$ of the second directional coupler device 900-2. Read coupling is performed of a second RF signal for the second transmitter 1002 by the second directional coupler device 900-2, where the isolation port $P_{I2}$ is connected to the coupling reading port $P_{C3}$ of the third directional coupler device 900-3. Read coupling is performed of a third RF signal for the third transmitter 1003 by the third directional coupler device 900-3, where the isolation port $P_{I3}$ is connected to ground via external termination resistance 1049. Generally, the first to third transmitters 1001-1003 may not be transmitting simultaneously, but rather operate one at a time.

In this configuration, the coupled power from each of the first to third directional coupler devices 900-1 to 900-3 may be detected by a single power detector, the first power detector 1011, connected to the coupling reading port $P_{C1}$ of the first directional coupler device 900-1. Thus, daisy chaining reduces the number of power detectors required to determine the coupled powers.

Referring to FIG. 10C, coupling of RF signals from the three transmitters is performed by three directional couplers, respectively, that are daisy chained for reading forward power and reverse power. The configuration in FIG. 10C includes a double-pole double-throw (DPDT) switch 1020 that selectively connects the daisy chained first to third directional coupler devices 900-1 to 900-3 to the power detector 1011 and the external termination resistance 1049.

That is, read coupling is performed of a first RF signal for the first transmitter 1001 by the first directional coupler device 900-1, where the coupling reading port $P_{C1}$ is connected to a first port of the DPDT switch 1020 and the isolation port $P_{I1}$ is connected to the coupling reading port $P_{C2}$ of the second directional coupler device 900-2. Read coupling is performed of a second RF signal for the second transmitter 1002 by the second directional coupler device 900-2, where the isolation port $P_{I2}$ is connected to the coupling reading port $P_{C3}$ of the third directional coupler device 900-3. Read coupling is performed of a third RF signal for the third transmitter 1003 by the third directional coupler device 900-3, where the isolation port $P_{I3}$ is connected to a second port of the DPDT switch 1020. A third port and a fourth port of the DPDT switch 1020 are connected to the external termination resistance 1049 and the first power detector 1011, respectively.

When the DPDT switch 1020 switches the first port to the fourth port, and switches the second port to the third port, the coupling reading port $P_{C1}$ of the first directional coupler device 900-1 connects to the first power detector 1011, and the isolation port $P_{I3}$ of the third directional coupler device 900-3 connects to the external termination resistance 1049. In this configuration, the first power detector 1011 reads forward power from the first to third directional coupler devices 900-1 to 900-3, respectively. In comparison, when the DPDT switch 1020 switches the first port to the third port, and switches the second port to the fourth port, the coupling reading port $P_{C1}$ connects to the external termination resistance 1049, and the isolation port $P_{I3}$ connects to the first power detector 1011. In this configuration, the first power detector 1011 reads reverse power from the first to third directional coupler devices 900-1 to 900-3. In an embodiment, the configuration of the DPDT switch 1020 may be controlled by a baseband chipset, for example, although other ways of implementing control may be implemented without departing from the scope of the present teachings.

In an embodiment, a method provides different coupling factors of an asymmetric dual directional coupler that includes two asymmetric coupled lines, a long coupled line and a short coupled line (which is relatively shorter in length than the long coupled line). A coupling switching circuit facilitates selection of the coupling factors by switching to one of the two asymmetric coupled lines to accommodate different frequency ranges over a wide frequency range (wide bandwidth), as discussed above.

The method includes receiving an RF signal that passes through a main line of the asymmetric dual directional coupler, and selecting one of the long coupled line or the short coupled line by operating switches connected to first and second end ports of each of the long coupled line and the short coupled line, depending on frequency of the RF signal. The selected one of the long coupled line or the short coupled line is electrically coupled to the main line, and forward or reverse power of the RF signal passing through the main line is read out via the coupled one of the long coupled line and the short coupled line.

More particularly, the long coupled line is selected by operation of the switches for lower frequencies in the (total) wide bandwidth of the RF signal (e.g., below a predetermined transition frequency fp), and the short coupled line is selected for higher frequencies in the (total) wide bandwidth of the RF signal (e.g., higher than the predetermined transition frequency fp). Selecting the long coupled line includes connecting its end ports to a coupling reading port $P_C$ and to ground via a termination resistance, respectively. Either end port may be connected to the coupling reading port $P_C$ or to ground, enabling the long coupled line to read forward or reverse power from the main line in the lower frequency range. Selecting the short coupled line includes connecting its end ports to the coupling reading port $P_C$ and to ground via a termination resistance, respectively. Either end port may be connected to the coupling reading port $P_C$ or to ground, enabling the short coupled line to read forward or reverse power from the main line in the higher frequency range. Both end ports of the unselected one of the long coupled line or the short coupled line are floated by operation of the respective switches. The method mitigates excessive power loss in the higher frequency range, while satisfying coupling criteria, thereby substantially enlarging the applicable frequency range.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A directional coupler device, comprising:
an asymmetric dual directional coupler for receiving a radio frequency (RF) signal, the asymmetric dual directional coupler comprising:
a main line having an input port and an output port;
a plurality of coupled lines separated from the main line, the plurality of coupled lines having different lengths for providing a corresponding plurality of different coupling factors, respectively, wherein each coupled line comprises first and second ports; and
a switching circuit for selectively applying one of the different coupling factors corresponding to the plurality of coupled lines, depending on frequency of the RF signal in relation to a predetermined threshold frequency, while coupling a portion of forward power or reverse power of the RF signal to a coupling reading port, to mitigate power loss in an upper frequency range of the RF signal, while satisfying coupling criteria.

2. The directional coupler device of claim 1, wherein the switching circuit applies a first coupling factor corresponding to a first coupled line of the plurality of coupled lines for coupling forward power or reverse power of the RF signal in a lower frequency range lower the predetermined threshold frequency, and applies a second coupling factor corresponding to a second coupled line of the plurality of coupled lines for coupling forward power or reverse power of the RF signal in an upper range higher than the predetermined threshold frequency, and
wherein the first coupled line is longer than the second coupled line.

3. The directional coupler device of claim 1, wherein the switching circuit comprise a plurality of tristate switches connected to the first and second ports of the plurality of coupled lines, respectively, the plurality of tristate switches being configured to selectively couple one of the plurality of coupled lines to the coupling reading port and float one of the plurality of coupled lines.

4. The directional coupler device of claim 3, wherein each of the tristate switches comprises a terminated state, a reading state and a floating state.

5. The directional coupler device of claim 4, wherein first tristate switches of the plurality of tristate switches are respectively connected to the first and second ports of the coupled one of the coupling lines, and second tristate switches of the plurality of tristate switches are respectively connected to the first and second ports of the floated one of coupling lines,
wherein one of first tristate switches is in the termination state to connect the first port to ground via a resistance and another of the first tristate switches is in the reading state to connect the second port to the coupling reading port, and
wherein both of the second tristate switches are in the floating state.

6. The directional coupler device of claim 1, further comprising:
an interface for outputting a plurality of control bits to control operation of the switching circuit.

7. The directional coupler device of claim 6, wherein the switching circuit comprises a plurality of tristate switches connected to the first and second ports of the plurality of coupled lines, respectively, and a switching controller for controlling operation of the plurality of tristate switches in response to the plurality of control bits.

8. The directional coupler device of claim 7, wherein the switching controller comprises a logic circuit.

9. The directional coupler device of claim 1, wherein the coupled lines are in a different metal layer than the main line, enabling broadside coupling of the coupled line corresponding to the applied coupling factor.

10. The directional coupler device of claim 1, wherein the coupled lines are in a same metal layer as the main line, enabling edge coupling of the coupled line corresponding to the applied coupling factor.

11. A directional coupler device, comprising:
an asymmetric dual directional coupler, comprising:

a main line having an input port for receiving a radio frequency (RF) signal and a transmission port;
a first coupled line having a first length; and
a second coupled line having a second length shorter than the first length; and
a switching circuit for selectively connecting one of the first coupled line and the second coupled line to a coupling reading port, depending on frequency of the RF signal received the by the input port of the main line, in order to couple a portion of forward or reverse power of the RF signal in the main line to the coupling reading port, the switching circuit comprising:
first switches connected to respective ports of the first coupled line;
second switches connected to second respective ports of the second coupled line; and
a switching controller for controlling operation of the first and second switches, wherein when the frequency of the RF signal is lower than a predetermined threshold frequency, the switching controller connects the first coupled line to the coupling reading port through one of the ports of the first coupled line, and when the frequency of the RF signal is higher than the predetermined threshold frequency, the switching controller connects the second coupled line to the coupling reading port through one of the ports of the second coupled line.

12. The directional coupler device of claim 11, wherein the switching circuit further comprises a coupling matching circuit connected to the coupling reading port, and configured to compensate for parasitic capacitance from at least one of the first and second switches.

13. The directional coupler device of claim 11, wherein each of the first and second switches comprises a tristate switch having a terminated state, a reading state and a floating state.

14. The directional coupler device of claim 13, wherein connecting the first coupled line to the coupling reading port through one of the ports of the first coupled line comprises switching one of the first switches to the reading state and another of the first switches to the terminated state, and the second switches to the floating state, to read the forward power when the frequency of the RF signal is lower than the predetermined threshold frequency.

15. The directional coupler device of claim 13, wherein connecting the first coupled line to the coupling reading port through one of the ports of the first coupled line comprises switching one of the first switches to the terminated state and another of the first switches to the reading state, and the second switches to the floating state, to read the reverse power when the frequency of the RF signal is lower than the predetermined threshold frequency.

16. The directional coupler device of claim 13, wherein connecting the second coupled line to the coupling reading port through one of the ports of the second coupled line comprises switching one of the second switches to the reading state and another of the second switches to the terminated state, and the first switches to the floating state, to read the forward power when the frequency of the RF signal is higher than the predetermined threshold frequency.

17. The directional coupler device of claim 13, wherein connecting the second coupled line to the coupling reading port through one of the ports of the second coupled line comprises switching one of the second switches to the terminated state and another of the second switches to the reading state, and the first switches to the floating state, to read the reverse power when the frequency of the RF signal is higher than the predetermined threshold frequency.

18. The directional coupler device of claim 11, wherein the switching controller comprises a logic circuit.

19. The directional coupler device of claim 11, further comprising:
an interface for outputting a plurality of control bits to the switching controller, in response to user input, for controlling operation of the first and second switches.

20. A wireless communication device, comprising:
a first asymmetric dual directional coupler device for receiving a first radio frequency (RF) signal, the first asymmetric dual directional coupler device comprising:
a first main line having an first input port and a first output port; and
a plurality of first coupled lines separated from the first main line, the plurality of first coupled lines having different lengths for providing a corresponding plurality of first different coupling factors;
a first switching circuit for selectively applying one of the first different coupling factors corresponding to the plurality of first coupled lines, depending on first frequency of the RF signal in relation to a first predetermined threshold frequency; and
a second asymmetric dual directional coupler device for receiving a second RF signal, the second asymmetric dual directional coupler device comprising:
a second main line having an second input port and a second output port;
a plurality of second coupled lines separated from the second main line, the plurality of second coupled lines having different lengths for providing a corresponding plurality of second different coupling factors; and
a second switching circuit for selectively applying one of the second different coupling factors corresponding to the plurality of second coupled lines, depending on second frequency of the RF signal in relation to a second predetermined threshold frequency,
wherein the first and second switching circuits are configured to electrically couple one of the plurality of first coupled lines to one of the plurality of second coupled lines in series.

* * * * *